United States Patent [19]
Lord et al.

[11] Patent Number: 5,798,137
[45] Date of Patent: Aug. 25, 1998

[54] METHOD FOR SILICON DEPOSITION

[75] Inventors: Stephen M. Lord, Encinitas, Calif.; Robert J. Milligan, Moses Lake, Wash.

[73] Assignee: Advanced Silicon Materials, Inc., Moses Lake, Wash.

[21] Appl. No.: 481,801

[22] Filed: Jun. 7, 1995

[51] Int. Cl.$^6$ .................................................. C23C 16/24
[52] U.S. Cl. .................. 427/213; 427/248.1; 427/255.1; 427/255.5; 427/307; 216/37; 216/79; 423/349
[58] Field of Search ..................... 427/213, 248.1, 427/255.1, 255.5, 307; 216/37, 79; 423/349; 422/143; 118/DIG. 5

[56] References Cited

U.S. PATENT DOCUMENTS

| | | | |
|---|---|---|---|
| 2,404,474 | 7/1946 | Collins | 73/15 |
| 2,488,406 | 11/1949 | Hirsch | 422/146 X |
| 2,489,135 | 11/1949 | Himmel et al. | 219/47 |
| 2,494,716 | 1/1950 | McMahon et al. | 219/47 |
| 2,533,666 | 12/1950 | Gunness | 422/146 X |
| 2,561,396 | 7/1951 | Matheson | 209/474 |
| 2,595,620 | 5/1952 | Wagner et al. | 23/14 |
| 2,602,134 | 7/1952 | Nelson | 219/47 |
| 2,606,144 | 8/1952 | Leffer | 422/146 X |
| 2,766,880 | 10/1956 | Schaub et al. | 209/138 |
| 2,915,790 | 12/1959 | Rice | 19/72 |
| 2,925,357 | 2/1960 | Kothen | 117/121 |
| 2,968,683 | 1/1961 | Kossmann | 260/683 |
| 3,006,734 | 10/1961 | Cowlard et al. | 23/223.5 |
| 3,012,861 | 12/1961 | Ling | 422/139 X |
| 3,012,862 | 12/1961 | Bertrand et al. | 23/223.5 |
| 3,012,865 | 12/1961 | Pellin | 23/308 |
| 3,014,791 | 12/1961 | Benzing et al. | 23/373 |
| 3,020,128 | 2/1962 | Adcock et al. | 23/223.5 |
| 3,020,129 | 2/1962 | Herrick | 422/146 X |
| 3,041,144 | 6/1962 | Schering | 23/223.5 |
| 3,041,145 | 6/1962 | Aries | 23/223.5 |

(List continued on next page.)

FOREIGN PATENT DOCUMENTS

| | | | |
|---|---|---|---|
| 521842 | 2/1956 | Canada. | |
| 0 363 742 | 4/1990 | European Pat. Off. | 423/349 |
| 363742 | 4/1990 | European Pat. Off. | |
| 50-26763 | 3/1975 | Japan. | |
| 58-204814 | 11/1983 | Japan. | |
| 58-213623 | 12/1983 | Japan. | |
| 59-45917 | 3/1984 | Japan. | |
| 60-5013 | 1/1985 | Japan. | |
| 61-31312 | 2/1986 | Japan | 423/349 |
| 6-127922 | 5/1994 | Japan. | |
| 581362 | 11/1977 | U.S.S.R. | |

OTHER PUBLICATIONS

Breneman, et al., "Feasibility of a Process for Low–Cost, High–Volume Production of Silane and Pyrolysis of Silane to Semi–Conductor–Grade Silicon," *Quarterly Progress Report*, DOE/JPL 954334–78/5, Oct.–Dec. 1977, 74 pp.

Dunlop, et al., "Particle Size Control in Fluid Coking," *Chemical Engineering Progress*, vol. 54, No. 8, Aug. 1958, pp. 39, 43.

*The Canadian Journal of Chemical Engineering*, vol. 37, Apr. 1959, H.A. Becker, "The Effects of Shape and Reynolds Number on Drag in the Motion of a Freely Oriented Body in an Infinite Fluid," pp. 85–91.

*Journal of Crystal Growth*, vol. 64, 1983, A.M. Beers et al, "CVD Silicon Structures Formed by Amorphous and Crystalline Growth," pp. 563–571, (no month).

*Primary Examiner*—Shrive Beck
*Assistant Examiner*—Timothy Meeks
*Attorney, Agent, or Firm*—Klarquist Sparkman Campbell Leigh & Whinston, LLP

[57] ABSTRACT

Silicon beads are produced by chemical vapor deposition (CVD) on seed particles generated internal to a CVD reactor. The reactor has multiple zones, including an inlet zone where beads are maintained in a submerged spouted bed and an upper zone where beads are maintained in a bubbling fluidized bed. A tapered portion of the upper zone segregates beads by size. Systems for inspecting, sorting and transporting product beads are also disclosed.

35 Claims, 6 Drawing Sheets

U.S. PATENT DOCUMENTS

| | | | |
|---|---|---|---|
| 3,042,494 | 7/1962 | Gutsche | 422/199 X |
| 3,050,365 | 8/1962 | Nelson et al. | 23/200 |
| 3,053,638 | 9/1962 | Reiser | 23/223.5 |
| 3,067,005 | 12/1962 | Nelson et al. | 422/146 X |
| 3,104,155 | 9/1963 | Lewis | 23/1 |
| 3,171,009 | 2/1965 | Scheller et al. | 219/10.55 |
| 3,184,493 | 5/1965 | Kunze et al. | 422/146 |
| 3,249,462 | 5/1966 | Jung et al. | 117/71 |
| 3,288,567 | 11/1966 | Graham | 422/147 |
| 3,305,661 | 2/1967 | Shine et al. | 219/50 |
| 3,359,707 | 12/1967 | Jean | 85/33 |
| 3,369,873 | 2/1968 | Ullrich et al. | 422/198 X |
| 3,370,938 | 2/1968 | Newman et al. | 75/9 |
| 3,376,109 | 4/1968 | Stedman | 422/198 X |
| 3,390,078 | 6/1968 | Hatch | 422/146 X |
| 3,404,078 | 10/1968 | Goldberger | 204/164 |
| 3,499,947 | 3/1970 | Johnson | 260/680 |
| 3,528,179 | 9/1970 | Smith | 34/1 |
| 3,550,773 | 12/1970 | Villani et al. | 209/138 |
| 3,577,207 | 5/1971 | Kirjushin | 315/39 |
| 3,578,296 | 5/1971 | Boucraut et al. | 34/57 R X |
| 3,594,215 | 7/1971 | Wakefield | 117/100 |
| 3,644,100 | 2/1972 | Lhonore et al. | 23/288.5 |
| 3,654,126 | 4/1972 | McNabney et al. | 264/314 |
| 3,734,846 | 5/1973 | McNabney et al. | 204/176 |
| 3,826,739 | 7/1974 | Kubo et al. | 208/157 |
| 3,831,747 | 8/1974 | Scott et al. | 209/11 |
| 3,897,010 | 7/1975 | Weishaupt et al. | 241/5 |
| 3,941,869 | 3/1976 | Fuchs | 422/198 X |
| 3,948,640 | 4/1976 | Elvander et al. | 75/11 |
| 3,948,645 | 4/1976 | Elvander et al. | 75/26 |
| 3,963,838 | 6/1976 | Setty et al. | 427/213 |
| 3,970,567 | 7/1976 | Lowther | 250/533 |
| 3,993,450 | 11/1976 | Schora, Jr. et al. | 422/146 |
| 4,019,890 | 4/1977 | Fujita et al. | 71/64 F |
| 4,038,050 | 7/1977 | Lowther | 55/18 |
| 4,080,927 | 3/1978 | Brown | 118/48 |
| 4,092,446 | 5/1978 | Padovani et al. | 427/213 |
| 4,098,224 | 7/1978 | Norem et al. | 118/49 |
| 4,117,094 | 9/1978 | Blocher et al. | 423/342 |
| 4,126,757 | 11/1978 | Smith, Jr. et al. | 219/406 X |
| 4,135,889 | 1/1979 | Mori | 422/147 X |
| 4,147,911 | 4/1979 | Nishitani | 219/10.55 M |
| 4,154,870 | 5/1979 | Wakefield | 427/8 |
| 4,158,695 | 6/1979 | Ishizuka et al. | 422/241 X |
| 4,172,667 | 10/1979 | Zenz et al. | 366/107 |
| 4,176,710 | 12/1979 | Gansauge et al. | 165/104.16 X |
| 4,207,360 | 6/1980 | Padovani | 427/213 |
| 4,213,937 | 7/1980 | Padovani | 422/147 X |
| 4,221,182 | 9/1980 | Brown | 118/716 |
| 4,237,151 | 12/1980 | Strongin et al. | 427/74 |
| 4,249,032 | 2/1981 | Smith, Jr. et al. | 219/406 X |
| 4,292,344 | 9/1981 | McHale | 427/45.1 |
| 4,298,789 | 11/1981 | Eichelberger et al. | 219/406 |
| 4,299,693 | 11/1981 | Paulson | 209/3 |
| 4,299,694 | 11/1981 | Goodell | 209/139 R |
| 4,306,891 | 12/1981 | Clarke et al. | 55/274 |
| 4,307,242 | 12/1981 | Shah et al. | 556/472 |
| 4,314,525 | 2/1982 | Hsu et al. | 118/716 |
| 4,314,899 | 2/1982 | Styring, Jr. | 208/11 R |
| 4,318,942 | 3/1982 | Woerner et al. | 423/349 |
| 4,341,749 | 7/1982 | Iya et al. | 423/349 |
| 4,345,142 | 8/1982 | Dietze | 219/553 X |
| 4,387,120 | 6/1983 | Barnert | 427/213 |
| 4,388,080 | 6/1983 | Kapvr et al. | 23/293 R |
| 4,416,913 | 11/1983 | Ingle et al. | 427/45.1 |
| 4,424,199 | 1/1984 | Iya | 423/349 |
| 4,433,233 | 2/1984 | Hierholzer, Jr. et al. | 219/553 |
| 4,435,374 | 3/1984 | Helm, Jr. | 204/157.43 |
| 4,443,361 | 4/1984 | Hierholzer, Jr. et al. | 219/553 X |
| 4,444,811 | 4/1984 | Hsu et al. | 427/213 |
| 4,476,098 | 10/1984 | Nakamori et al. | 422/140 |
| 4,486,473 | 12/1984 | Kaae et al. | 427/249 |
| 4,490,828 | 12/1984 | Fukuhara et al. | 219/553 X |
| 4,519,999 | 5/1985 | Coleman et al. | 423/337 |
| 4,525,334 | 6/1985 | Woditsch et al. | 423/324 |
| 4,528,092 | 7/1985 | Krambrock et al. | 209/139 R |
| 4,537,759 | 8/1985 | Walker et al. | 423/349 |
| 4,542,043 | 9/1985 | Abe et al. | 427/213 |
| 4,543,240 | 9/1985 | Goldberger | 423/346 |
| 4,557,904 | 12/1985 | Brod et al. | 422/146 |
| 4,559,719 | 12/1985 | Dodson | 422/146 X |
| 4,565,913 | 1/1986 | Yatsurugi et al. | 219/10.55 M |
| 4,567,940 | 2/1986 | Klaren | 422/146 X |
| 4,585,643 | 4/1986 | Barker, Jr. | 423/342 |
| 4,585,673 | 4/1986 | Sigai | 427/213 |
| 4,594,270 | 6/1986 | Brooks | 427/213 |
| 4,640,768 | 2/1987 | Morboili et al. | 209/37 |
| 4,642,227 | 2/1987 | Flagan et al. | 423/349 |
| 4,642,228 | 2/1987 | Sanjurjo et al. | 423/350 |
| 4,661,335 | 4/1987 | Boudot et al. | 423/348 |
| 4,668,493 | 5/1987 | Levin | 422/241 X |
| 4,676,968 | 6/1987 | Sanjurjo et al. | 423/350 |
| 4,684,513 | 8/1987 | Iya | 423/349 |
| 4,691,866 | 9/1987 | Belk | 241/10 |
| 4,737,348 | 4/1988 | Levin | 423/350 |
| 4,746,547 | 5/1988 | Brown et al. | 427/213 |
| 4,748,052 | 5/1988 | Allen | 427/213 |
| 4,749,845 | 6/1988 | Rasmussen et al. | 219/553 |
| 4,755,658 | 7/1988 | Wilsey | 219/553 X |
| 4,784,840 | 11/1988 | Gautreaux et al. | 423/349 |
| 4,786,477 | 11/1988 | Yoon et al. | 422/145 |
| 4,789,596 | 12/1988 | Allen et al. | 428/404 |
| 4,806,317 | 2/1989 | Boone et al. | 422/145 |
| 4,818,495 | 4/1989 | Iya | 422/145 |
| 4,820,587 | 4/1989 | Gautreaux et al. | 428/403 |
| 4,825,124 | 4/1989 | Sigai | 313/486 |
| 4,868,013 | 9/1989 | Allen | 427/213 |
| 4,883,687 | 11/1989 | Gautreaux et al. | 427/213 |
| 4,900,411 | 2/1990 | Poong et al. | 204/157.43 |
| 4,904,452 | 2/1990 | Acharya et al. | 422/146 |
| 4,906,441 | 3/1990 | Flagella | 422/146 |
| 4,992,245 | 2/1991 | Van Slooten et al. | 422/146 |
| 5,037,503 | 8/1991 | Kajimoto et al. | 156/620.1 |
| 5,059,410 | 10/1991 | Boone et al. | 423/349 |
| 5,139,762 | 8/1992 | Flagella | 423/349 |
| 5,165,908 | 11/1992 | Van Slooten et al. | 423/349 |
| 5,171,734 | 12/1992 | Sanjurjo et al. | 505/1 |
| 5,175,942 | 1/1993 | Dutta et al. | 34/10 |
| 5,211,802 | 5/1993 | Kaneko et al. | 156/616.2 |
| 5,225,005 | 7/1993 | Burrage et al. | 148/108 |
| 5,242,671 | 9/1993 | Allen et al. | 423/349 |
| 5,284,676 | 2/1994 | Accuntius et al. | 427/8 |
| 5,326,547 | 7/1994 | Allen et al. | 423/349 |
| 5,358,603 | 10/1994 | Ibrahim et al. | 156/657 |
| 5,374,413 | 12/1994 | Kim et al. | 423/349 |

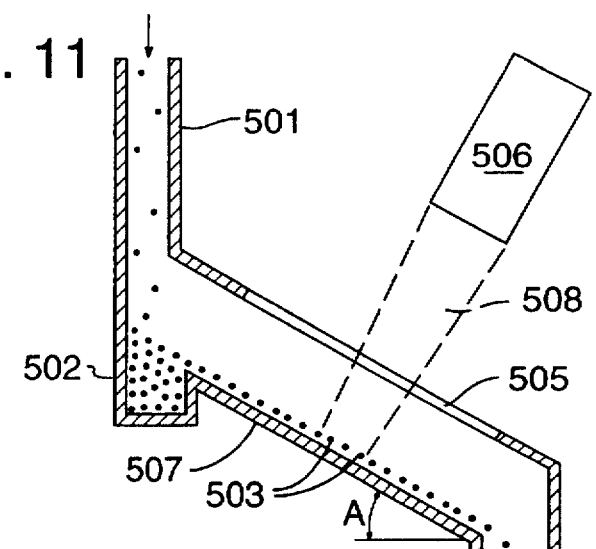
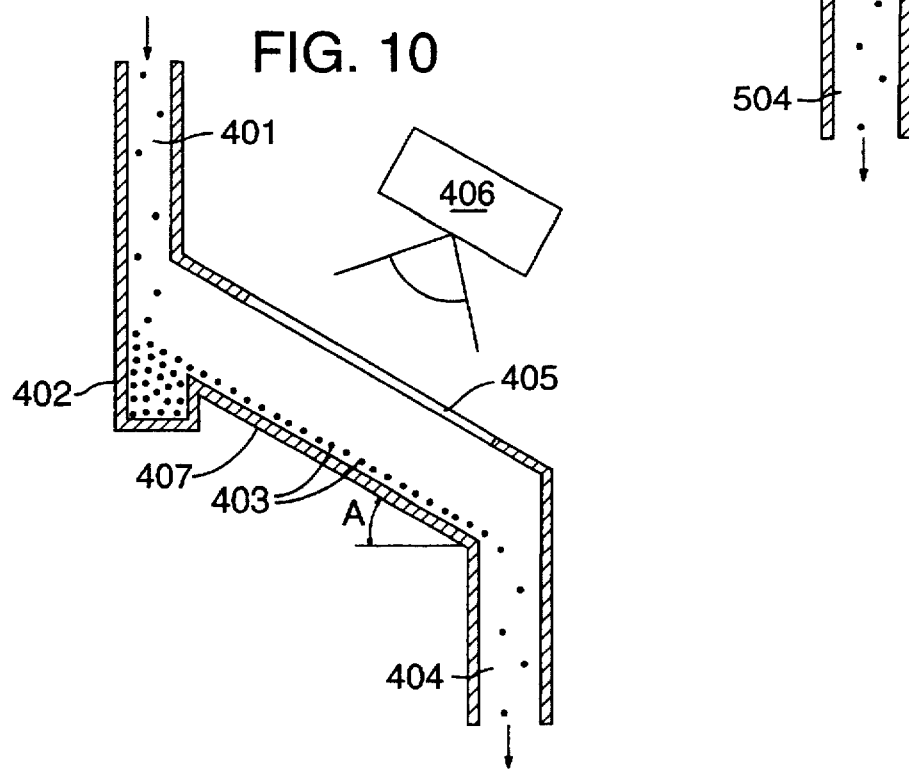
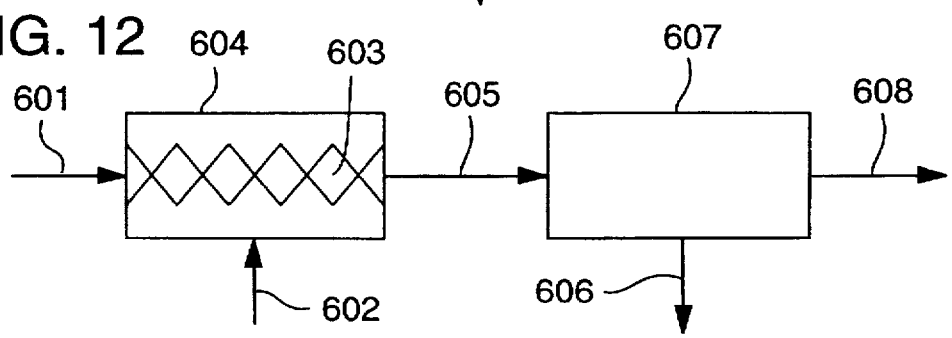

METHOD FOR SILICON DEPOSITION

BACKGROUND OF THE INVENTION

This invention relates to apparati and methods for producing chemical vapor deposition (CVD) reactions on seed particles generated internal to a CVD reactor and more particularly to improved techniques for converting silicon-bearing gases to polycrystalline silicon in a solid form.

DEFINITIONS

For the purpose of this disclosure, the following terms are used throughout the text with the given definitions:

Amorphous Silicon: solid silicon without periodic atomic structure. Amorphous silicon may be formed when the atoms are not given an opportunity to be arranged properly for some reason, such as inhibiting their mobility, for instance, with low temperature. Amorphous silicon can be hydrogenated or not, depending on conditions of formation.

Dead Zone: area within a fluidized bed where there is little or no movement of the particles which constitute the bed. If the particles are sticky, such as those above the Tammann temperature, they tend to agglomerate in dead zones due to lack of sufficient agitation.

Dense Phase Segregation: segregation of solid particles by size which takes place within the regime typical of fluidized beds where bed voidage ($\epsilon$) is between 0.35 and 0.55. Operation in this regime means that the particles are close enough together that they are acted upon collectively rather than individually. This segregation can take place within the fluidized bed CVD reactor and does not inherently require a separate vessel. Conditions in the fluidized bed regime are typically well mixed. Segregation is effected through exploitation of velocity and pressure gradients normally present or induced in the bed by the geometry of the vessel.

Dilute Phase Segregation: segregation of solid particles by size which takes place within the regime typical of pneumatic transport where voidage ($\epsilon$) is in excess of 0.8. Operation in this regime means that the particles are well separated from each other. At voidage in excess of 0.99 and container-to-particle-diameter ratios greater than 100 the particles are acted upon individually rather than collectively. At voidage between 0.8 and 0.99 and container-to-particle-diameter ratios less than 100 there is some interaction with neighboring particles and the wall of the vessel known as concentration effects and wall effects, respectively, or as hindered settling, collectively. This segregation usually takes place in a vessel separate from the fluidized bed reactor vessel or requires internals in the reactor vessel to create a dilute zone for segregation. Segregation is effected through exploitation of Stokes' law or separation by terminal velocity, with or without hindered settling, well described in the section titled "Particle Dynamics" in *Perry's Chemical Engineers' Handbook*, 6th ed., R. H. Perry and D. Green, McGraw-Hill (New York, N.Y.) 1984, p. 5–63 to 5–68.

Diluent Gas: any of the group consisting of hydrogen ($H_2$), helium (He), argon (Ar), neon (Ne), krypton (Kr), xenon (Xe), and mixtures thereof.

Granular Filtration: removal of particles from a gas stream effected by passing the gas stream through a bed of particles, usually larger than the particles to be removed. The theory of granular filtration is well described in the section titled "Gas-Solids Separation" in *Perry's*, 6th ed., p. 20–75 to 20–82 with several references. Application of granular filtration in fluidized beds is briefly described on p. 20–104.

Halogen-containing Gas: any of the group consisting of chlorine ($Cl_2$), hydrogen chloride (HCl), dichlorosilane ($SiH_2Cl_2$), trichlorosilane ($SiHCl_3$), silicon tetrachloride ($SiCl_4$), bromine ($Br_2$), hydrogen bromide (HBr), dibromosilane ($SiH_2Br_2$), tribromosilane ($SiHBr_3$), silicon tetrabromide ($SiBr_4$), iodine ($I_2$), hydrogen iodide (HI), diiodosilane ($SiH_2I_2$), triiodosilane ($SiHI_3$), silicon tetraiodide ($SiI_4$), and mixtures thereof.

Heating Light Source: coherent or noncoherent electromagnetic radiation such as microwave, radio frequency, visible light, infrared, or ultraviolet radiation having a wavelength distribution such that the energy absorbed by a silicon-bearing gas inside the inlet to a CVD reactor is insufficient to cause premature decomposition and such that residual energy is absorbed by silicon beads in the reactor.

High Purity Silicon-containing Material of Construction: any of the group consisting of monocrystalline silicon ($Si_x$), polycrystalline silicon (Si), silica ($SiO_2$), silicon carbide (SiC), silicon carbide (SiC) coated graphite (C), and silicon nitride (SiN).

Jet Penetration Length (P): the distance that a jet of gas will penetrate into a bed of particles. For upwardly pointed jets the jet penetration length is calculated as a ratio with the orifice diameter as $$P/D_o = 52 \cdot \log_{10}(u_o \cdot \rho_i^{1/2}) - 98.046 \qquad (1)$$

where

P=jet penetration length [=] cm $D_o$=orifice diameter [=] cm $u_o$=orifice velocity [=] cm/s $\rho_i$=inlet gas density [=] g/cm$^3$.

The above equation was curve fit from FIG. 30 in Zenz, F.A., *Fluidization and Fluid Particle Systems, Vol. II Draft*, Pemm-Corp. Publications (Nelsonville, N.Y., 1989) p. 148.

Kinetic Power: kinetic energy expended per unit time. For a gas stream the kinetic power can be described mathematically for grinding as $$P_k = G \cdot v^2 / 2 \qquad (2)$$

where $P_k$=kinetic power [=] mass·length$^2$/time$^3$

G=mass flow rate through an orifice=$\rho \cdot Q$ [=] mass/time $\rho$=gas density [=] mass/length$^3$ Q=volumetric flow rate through an orifice [ ] length$^3$/time v=gas velocity through the same orifice [=] length/time.

The gas velocity, v, is related to the volumetric flow as $$v = Q/S \qquad (3)$$

where

S=cross-sectional area of the orifice [=] length$^2$.

Gas density can be described by the ideal gas equation modified for compressibility $$\rho = M \cdot P / Z \cdot R \cdot T \qquad (4)$$

where

M=molecular weight [=] mass/mole

P=absolute pressure [=] force/length$^2$

Z=compressibility [=] dimensionless

R=gas constant [=] units consistent to equation, e.g., 82.057 cm$^3$·atm/(g-mol·K) T=absolute temperature [=] temperature.

and cross-sectional area of the orifice can be described in terms of orifice diameter as $$S=(\pi/4) \cdot D_o^2 \quad (5)$$

where $D_o$=orifice diameter |=| length.

Substituting equations 3, 4, and 5 into equation 2

$$P_k=8 \cdot (R/\pi)^2 \cdot (Z/M)^2 \cdot G^3/D_o^4. \quad (6)$$

The first terms are constants. Temperature and pressure are under the control of the operator. An increase in temperature will increase the kinetic power while an increase in pressure will decrease the kinetic power. Compressibility and molecular weight are properties of the gas stream selected. Compressibility gains in importance as operating conditions approach critical temperature and pressure for the gas. Mass flow rate is proportional as a cubed term. Orifice diameter is a strong function, being inversely proportional to the fourth power. Major process changes, such as changing the silicon-bearing gas, can be compensated by changing orifice diameter.

Minimum Fluidization Velocity ($u_{mf}$): the superficial gas velocity through a bed of particles below which the bed stays fixed, that is, the particles in the bed do not move, and above which the bed is at incipient fluidization, that is, the particles in the bed just barely begin to move about as bubbles begin to form. The minimum fluidization velocity is calculated using the properties of the gas and the solid, and particularly by the diameter of the solid particles per the following equation:

$$u_{mf}=[d_p/\phi]^2 \cdot [\epsilon^3/(1-\epsilon)] \cdot [g/181] \cdot [(\rho_p-\rho_g)/\mu_g] \quad (7)$$

where $u_{mf}$=minimum fluidization velocity [=] cm/s
$d_p$=particle diameter [=] cm
$\phi$=particle sphericity [=] dimensionless
$\epsilon$=bed voidage [=] dimensionless
g=acceleration of gravity=980 cm/s$^2$
$\rho_p$=particle density [=] g/cm$^3$
$\rho_g$=gas density [=] g/cm$^3$
$\mu_g$=gas viscosity [=] g/cm/s=P.

Particle Reynolds Number ($Re_p$): a dimensionless group describing the ratio of inertial forces to viscous forces, computed mathematically (in consistent units) as $$Re_p=\rho_g \cdot u_g \cdot d_p/\mu_g \quad (8)$$

where $Re_p$=Reynolds number [=] dimensionless
$\rho_g$=gas density [=] mass/length$^3$
$u_g$=superficial gas velocity [=] length/time
$d_p$=particle diameter [=] length
$\mu_g$=gas viscosity [=] mass/length/time.

Polycrystalline Silicon: solid silicon composed of atoms arranged in a three-dimensionally periodic pattern in which the periodic pattern is interrupted at boundaries. Also described as a solid formed by many small crystals, namely, grains, with different orientations.

Popcorning: a term used in crystal pulling to describe the undesirable phenomenon of small explosions of unmelted solids as they melt in the liquid bath, spattering solid fragments and some liquid. This spatter can land on the single crystal ingot, potentially causing crystal defects.

Silicon-bearing Gas: any of the group consisting of silane ($SiH_4$), disilane ($Si_2H_6$), dichlorosilane ($SiH_2Cl_2$), trichlorosilane ($SiHCl_3$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof.

Slip-coating Powder: any of the group consisting of silica ($SiO_2$), silicon carbide (SiC), silicon nitride (SiN), alumina ($Al_2O_3$), carbon (C), and mixtures thereof.

Submerged Spouted Bed: a mass of solid particles expanded and suspended by an upwardly directed jet of gas such that the mass or bed of particles exhibits many properties of a liquid. The jet forms a dilute phase in which particles are entrained and rapidly directed upward but do not leave the surface of the emulsion, or dense phase, surrounding the jet (typical of spouted beds) due to the depth of the bed of particles above the jet. The particles typically migrate slowly in the downward direction in the emulsion to be re-entrained and again lifted rapidly by the jet. While this phenomenon may be present for entrance jets in all gas distribution grids, it is usually small and ignored and applies best when there is a single upwardly directed entrance jet of gas.

Tammann Temperature: the temperature at which the surface of a solid shows a marked change in activity, for example, surface reaction rates typically increase significantly and silicon beads become sticky. The Tammann temperature can be approximated mathematically as 52% of the absolute melting temperature of the material.

Tapered Zone: a portion of a fluidized bed reactor in which the wall of the vessel is constructed such that the vessel diameter increases with increasing height to allow dense phase segregation within the enclosed fluidized bed.

Transport Disengaging Height (TDH): the distance from the surface of a fluidized bed of solids above which particle entrainment no longer decreases and the gas velocity profile has stabilized and the effective superficial velocity can be taken as the volumetric gas flow leaving the bed surface divided by the bed cross-sectional area. The TDH can be calculated using the method of Zenz and Weil found in Zenz, F. A., Weil, N. A., *A.I.Ch.E.J.* 4, 472 (1958) and frequently cited in fluidization texts and articles.

SUMMARY OF THE INVENTION

In order to achieve a specific end instead of just starting with that which has been done before and making marginal improvements, a definition of the desired product and process is presented here. The product polycrystalline silicon in granular form should have an average particle size as large as possible, somewhere between 1 mm and 3 mm, with as narrow a particle size distribution as possible, most advantageously skewed toward the larger sizes. The beads should be round (spherical), shiny (high crystallinity), free of dust, meet the same acceptor/donor, metals, and carbon requirements as chunk polycrystalline silicon, and have low hydrogen content to avoid popcorning in the crystal puller. The process should be cost effective, energy efficient, robust, easy to operate, easy to automate, easy to control, self-correcting, introduce no impurities, and take place in a single reactor, if possible. More specifically, the process should have internal self-seeding and segregation with selective withdrawal of large beads, avoid hydrogen contamination of the beads, and have a method to withdraw and package the product without contaminating it.

High purity silicon and similar materials are extensively used for the production of semiconductor devices. High purity silicon is typically obtained by thermal decomposition of silicon-bearing gases such as silane, dichlorosilane, trichlorosilane, or tribromosilane refined to remove substantially all impurities. The thermal decomposition is accomplished on a heated surface which then becomes coated with the elemental silicon released from the silicon-bearing gases. This process is called chemical vapor deposition (CVD). To avoid introducing contamination it is desirable that the starting or seed surface on which CVD occurs also be made of high purity silicon. The standard industry technique, hot wire or Siemens reactors, uses high purity rods as the seed surface. This technique is expensive in capital and operating cost, therefore, it is desirable to adopt an improved technology. Fluidized bed reactors offer the possibility of contacting a large surface area of heated silicon with silicon-bearing gas. Test and full scale fluid bed reactors have been built for the production of electronics grade silicon, but the prior technology has suffered from severe operational and purity problems and has not realized the full thermal and silicon conversion efficiencies.

The technology for fluidized bed reactors was developed in the petrochemical industry as a cost-effective means to bring solid reactant or catalytic particles into contact with reacting gas. Its commercial success led to research into application of this technology to silicon deposition. Many patents have been issued regarding deposition of silicon-bearing compounds on silicon particles. A gas containing a silicon-bearing compound is passed through a fluidized bed of silicon seed particles at a temperature high enough to decompose the silicon-bearing compound, typically 400° C. to 1200° C. Elemental silicon is then deposited on the seed particles which thereby increase in size. However, when fluidized beds are used for the production of elemental silicon, great practical difficulties are encountered with operation and purity. As the silicon particles in the bed grow, they tend to stick to each other to form agglomerates. They also stick to any other surface in the reactor including the reactor wall, reactor internals, and the particle support or gas distribution grid. Such deposits or agglomerates cause the reactor or grid to become plugged with deposited silicon or silicon particles, interrupting continued operation of the reactor. Erosion of the reactor wall, contamination from diluent gases or added seed particles, and harvesting and handling the product silicon beads all may make the silicon impure.

Use of silicon beads is primarily for growth of single crystal silicon ingots in Czochralski crystal pullers. Such pullers have particular requirements with regard to their ability to handle beads, surface contamination of the beads, hydrogen content of the beads, and bead behavior on melting. Much effort has been undertaken to resolve these issues, as documented in Kajimoto et al's U.S. Pat. No. 5,037,503. Investigators thus far have met with great difficulty, however, largely because some of the key issues underlying the transfer of fluidized bed technology from its success in petrochemicals (production of organic or carbon-based products) to silicon production are not obvious, even to one experienced in the field.

The development of fluidized bed reactors originated in the petrochemical industry with the development of the fluid catalytic cracker. In this reactor, the fluidized porous solid catalyst reacts with the gas bubbling through the particle bed to form the gaseous product that exits through the top of the reactor. The catalyst is valuable, so the reactor is designed not to lose fine particles of catalyst out the top of the reactor. The mathematical models that were developed to describe such "bubbling beds" inherently were developed using data from reactors designed to avoid the problems of particle attrition. It is known that particle attrition occurs primarily in the entry to the bed at the distributor plate where small jets of gas come through the grid and enter the mass of particles. Particles are entrained in the jet, then impact other particles in the bed, causing the particles to fragment or erode. Particle attrition also occurs at the cyclone where particles carried along in the exiting gas stream collide with the walls of the cyclone, causing the particles to break or erode. Thus, the standard technology for bubbling fluidized beds, which are the vast majority of fluidized beds, was developed in part to minimize attrition of fine catalyst particles.

Other work was also done in the petrochemical industry with the development of fluidized coking of heavy petroleum products. For example, Leffer describes such a fluidized coker in his U.S. Pat. No. 2,606,144. In such a coker, the fine dust particles are segregated from the large product particles and the dust particles retained at nuclei in the coker. No attempt was made to grind the larger particles; the fine sooty materials are simply retained within the reactor and are used as seeds for further growth.

When this fluid bed technology was transferred from the petrochemical industry to the production of polysilicon, certain hidden assumptions were transferred with it: that low attrition was desirable, that it was not desirable to grind within the reactor itself, and that fine seed particles would be suitable. Similar assumptions underlay other work on pyrolytic carbon coating of particles. This technology was primarily developed by Brown et al. at General Atomic, U.S. Pat. No. 4,080,927, as a method of depositing a pyrolytic carbon layer over a nuclear fuel particle. In such applications it is obviously very important to avoid any attrition of the nuclear fuel particle itself. It is not desirable to produce broken nuclear fuel particles, but instead, to insure a coating around the particles to contain the particles within that coating. This technology was also utilized in developing technology for the silicon fluidized bed reactor, but again, it inherently avoids the deliberate breaking of silicon particles to form new seeds. It should be noted that work was done in using jets to form seed for fluidized cokers by Dunlop et al., CEP. 54, 39 (1958), where particles were ground inside the reactor with and without targets and jets but this was not used in polysilicon technology until Iya, U.S. Pat. No. 4,424,199.

The prior process of preparing seed externally results in contamination from the container in which seeds are generated by some grinding technique. The problem of generating high purity seed for use in production of silicon was recognized by Iya in U.S. Pat. No. 4,424,199 which shows a jet of gas directed downwards into a dilute stream of particles in the separation boot of a silane pyrolysis reactor, which causes the beads to collide with each other and form fines. The major silicon-bearing gas flow is injected above the boot and is directed upwards in the reactor and is not used in any way for generation of seeds. Instead, a small high velocity jet of diluent gas is directed in the opposite direction through a nozzle.

It is difficult to control the average particle size in the reactor by adding or creating small amounts of very small seed, even more difficult when done batchwise. The growth periods of the seed can be on the order of days and changes in process conditions within the reactor can occur on the order of hours. Thus, it is inherently very difficult to control the particle size in the reactor and, heretofore, there has been no report about how such control may be achieved nor even a statement of the important parameters.

The present invention provides an improved technique for depositing solid silicon onto silicon beads in a fluidized bed reactor using a silicon-bearing source gas which uses a single inlet jet instead of a distributor, wherein the jet of silicon-bearing source gas is used to break up a small fraction of the silicon beads in the inlet zone of the reactor in order to form smaller particles, constituting new seeds, upon which further growth may then occur. The kinetic energy of the incoming gas is controlled such that it is sufficient to break up the amount of particles desired, but not so great such that too many particles will be broken up, reducing the average product particle size below that desired. The inlet jet is designed to provide a submerged spouted zone such that the large beads in the inlet area continuously circulate and thus are not prone to agglomerate as they would if they were stationary for any significant period of time, despite the velocity of the gas being below the minimum fluidization velocity.

The amount of seed generation can be controlled on-line within a narrow range by adjusting the kinetic power dissipated by the jet. As the power increases, more and smaller seeds are created. The kinetic power can be increased by an increase in the mass or volumetric flows and thus increases with an increase in temperature but decreases with an increase in pressure. Kinetic power can also be changed by changing the inlet gas properties, for instance, by dilution. Large changes in seed generation, however, require changing the orifice, a change that cannot be made on-line. The number of seeds generated must equal the number of beads harvested. This requires judicious use of mass flow rate control for kinetic power because increased mass flow rate of silicon-bearing gas also has a direct effect on the material balance by adding more silicon to the reactor. This in itself requires some additional grinding just to maintain the population balance. With proper design, seeds are generated continuously and internally, so there is no need to interrupt operation in any way to inject the seed, thus avoiding upset of the population balance. Thus, the problems of introduction of impurities with the seed and external control of the population balance within the reactor are both dealt with in a simple way.

An additional problem associated with prior fluidized beds is that there is no effective way to segregate the large particles to be removed as product from the small particles that have been added to the bed as seeds. That is, the product removed from the bed has a wide particle size distribution with a larger than desired amount of small seed particles. Ingle recognized this in U.S. Pat. No. 4,416,913 in which it was attempted to continuously circulate seed particles while removing larger particles from the base of the reactor with a complex arrangement of reactor internals.

The technology presented by Ingle can be seen to be similar to the technique used by Leffer in a coker and it relies explicitly on entraining the particles using Stokes' law, which is only applicable for dilute segregation. Use of terminal velocity to separate the beads, referred to by some investigators, is also dilute segregation. A Japanese patent application by Uteo of Hitachi Corporation, Sho 58-204814, also employed a very similar approach with entrainment of fine particles out of a mix of fine and heavy particles using a modified conical shape for the reactor to provide a change in velocity with height. Uteo's operation is still in the extremely dilute segregation regime where small particles are essentially behaving independently.

Dilute segregation is not a preferred approach because the large separation between the particles and the low surface area of particles relative to the distance between the particles promotes formation of undesirable byproduct: amorphous silicon dust or powder. Furthermore, it is difficult and expensive to construct and operate such a reactor since the reactor volume for a given production capacity must be considerably larger than a dense phase reactor of comparable throughput. All of the separation gas must pass through the reactor, as well as the process gas. This requires the segregation gas to be very pure and at or near reactor temperature. This segregation gas is usually a diluent, which inevitably dilutes the silicon-bearing gas in the reactor. In addition, considerable ancillary equipment is required to move, heat, and purify this large quantity of diluent gas, detracting from the efficiency of the reactor system and adding considerably to the cost of the overall process.

The design of Ingle also suffers from a practical point of view because of the number of internals in the reactor, all of which would inevitably become coated with silicon as described below. These internals appear to be an effort to create an internal vessel for dilute segregation. In an attempt to improve the operation, Ingle notes the use of microwaves as a preferred heating device since the microwaves may be coupled directly to the seed particle. Ingle's patent also refers to prior use of microwaves in the heating of silicon and the benefits thereof.

Iya, in U.S. Pat. No. 4,424,199, made an improvement on Ingle's segregation concept by making the seed generating vessel a boot on the bottom of the reactor rather than an internal. Since the seed generation is below the inlet of the silicon-bearing gas, the nozzle for the downward pointing jet and the wall of the boot are less likely to be coated with silicon than Ingle's internals. The patent suggests batchwise generation of seeds to avoid putting the seed into the product rather than the reactor, indicating that continuous segregation was not effective.

The prior systems use dilute phase segregation with the problems cited, probably because of familiarity. Dense phase segregation is much less common, but necessary in the present application of production of high purity polycrystalline silicon. Use of dense phase segregation avoids contamination from additional handling of the product and contamination from the segregating gases used in dilute phase segregation. The capital cost of additional vessels, and the large operating cost and effort of handling and purifying the segregation gases is also avoided.

Prior fluidized beds have been typically designed as dense phase, well-mixed beds with cylindrical walls; thus, as the gas proceeds up the reactor the pressure on the gas at any point decreases because the height of the bed pressing down on the gas is less. The volume and velocity of the gas increase and a velocity profile is set up such that the velocity increases with an increase in distance from the gas inlet datum. In such a design, the velocity profile is positive, i.e., the velocity increases as distance from the inlet datum increases. This provides good mixing rather than segregation of particles by size.

In order to achieve dense phase segregation according to the present invention, the velocity profile is chosen to be negative, i.e., as the height increases, the velocity decreases. This is done by tapering the walls of the reactor in such as way that the diameter increases as the height increases. More particularly, the cross-sectional area increases faster than the volumetric flow increases such that the upward gas velocity at any point in the column is lower than at the point just below it. This is called a negative velocity profile. In such a design the larger particles slowly segregate to the bottom of the zone as they are jostled by other particles in a mechanism akin to convection by friction. Smaller particles will tend to move to the top of the reactor by a similar mechanism. Thus, over time, the bed will become segregated with the larger particles at the lower portion of the bed where the velocity is higher and the small particles will be at upper portions of the bed where the velocity is lower. This segregation technique relies on a dense phase mechanism, not a dilute phase mechanism as in prior systems; Stokes' law and other dilute phase segregation mechanisms do not apply.

Use of such a tapered section directly above the inlet zone is beneficial because it encourages the smaller seed particles generated in the inlet zone to proceed further up the reactor where they have an opportunity to grow larger before they return to the bottom zone where they may leave with the product. At the same time, those particles that have grown in the reservoir section will drop down through the tapered zone in plug flow such that the larger particles will proceed into the inlet zone and receive a final deposit of silicon before exiting the reactor. This design will produce a narrower size distribution of relatively large particles, both of which are desirable.

It is possible to taper the entire upper section of the reactor, however, if this is done, all the small fine particles will go to the top of the reactor. As the concentration of silicon-bearing species decreases toward the top of the reactor the small particles at the top of the reactor will find it difficult to grow into larger sized particles. Futhermore, it will be necessary to make the reactor diameter considerably larger at the top than would otherwise be the case, thus adding to the cost of the reactor. It is best, then, that the upper portion of the reactor be returned to an essentially cylindrical form where the velocity profile is again positive after a tapered section has been used to segregate the particles prior to entry into the bottom zone where the final deposition occurs. A positive velocity profile mixes the upper portion of the bed, providing a larger average particle size than would otherwise be the case at the top of the reactor. Thus, all particles will circulate within this well-mixed zone and will have an equal chance to grow. Furthermore, the construction of the substantially cylindrical shape of a relatively smaller diameter is significantly less costly than that of a completely tapered shape of larger diameter.

Another desired result of the tapered zone is that the bubbles formed at the end of the jet in the inlet zone can continue up the reactor without extensively contacting the wall of the reactor. This will reduce the amount of silicon deposited on the wall of the reactor since the concentration of silicon-bearing species is expected to be higher in the bubble or dilute phase than in the emulsion or dense phase. Thus, wall deposit can be controlled to some degree by appropriate design of the taper, given the decreasing silicon-bearing gas concentration with increasing height in the reactor above the inlet jet datum. Wall deposits are further discussed below.

The methods of deposition are twofold. In the lower inlet zone, particularly in the jet, there is significant heterogeneous reaction in which the silicon-bearing gas is adsorbed onto the surface of the particles where it then decomposes and a fraction of the silicon deposits, the balance leaving the surface with the hydrogen coproduct. Homogeneous reaction with nucleation of the solid reaction product occurs in the gas phase resulting in formation of small (5 to 700 nm) amorphous silicon particles. These amorphous silicon particles travel up through the reactor bed above the inlet jet where they are filtered out by granular filtration mechanisms. Filtered silicon particles recrystallize on the silicon bead granular filter medium, becoming an indistinguishable part of the polycrystalline silicon beads. This constitutes the second method of deposition.

The jet also forms relatively large (100 to 1000 μm) seed particles, most of which are also entrained by the jet and carried up into the bead reservoir, thus segregating the small seeds from the large product. The seeds in the bead reservoir above the inlet zone grow at a slower rate than those closer to the higher concentration of inlet silicon-bearing gas. As the particles in the upper zone grow they migrate back into the lower area, thus segregation of particles by size occurs.

A portion of the amorphous silicon powder or dust is recirculated out of the jet through the beads as the gas and beads circulate. This powder reenters the jet at the bottom with the beads and grows by heterogeneous deposition. The presence of the large number of small dust particles acts to suppress homogeneous nucleation and increase the size of the particles formed. This is an important feature because larger dust particles are easier to filter out in the upper regions of the bed.

A big loss in the material balance, which becomes a major operational problem, has been the formation of this amorphous dust or powder. This amorphous silicon leaves the reactor, especially if a short bed is used as in most of the prior systems, and continues into the gas removal systems where it may deposit on the walls and cause various operational problems downstream of the reactor. Loss of this silicon reduces the conversion efficiency for the reactor and increases operating costs.

The generation and carryover of amorphous silicon have been recognized as a problem. A typical way of dealing with this problem has been the use of dilution of the silicon-bearing gas with hydrogen or inert gases to reduce the amount of amorphous silicon formation as described in Iya's U.S. Pat. No. 4,684,513, for example. Other methods have included operating at lower temperature so that not all the silane reacts, then quenching the silane decomposition reaction on the outlet of the reactor by rapidly reducing the temperature by injecting hydrogen as described in Allen's U.S. Pat. No. 4,868,013.

The disadvantage of the first approach is that additional gas must be provided to the reactor and this gas will most likely contain contaminants unless first purified. The reactor must be larger for a given production of silicon and the energy consumption will be increased by virtue of the need to heat the diluent gas up to reaction temperature.

The disadvantages of the second quenching approach are that additional gas must be provided for quenching and the unreacted silane must be either disposed of or recycled, again increasing the cost of the overall process. A further disadvantage is the introduction of contaminants into the reactor by means of the quenching gas or the need for expensive additional purification steps for the diluent gas since such diluent gases are known to contain contaminants such as carbon monoxide, carbon dioxide, hydrocarbons, oxygen, and water. While it may appear that gases injected above the top of the silicon bed cannot contaminate the silicon, this neglects the effect of the transport disengagement height (TDH). The TDH can be several feet tall and is the height above the bed to which particles can be thrown and still return to the bed. Particles that pass through the quenching gas and then return to the reactor become coated with contaminant layers, which are expected primarily to be silicon oxide. It is known by thermodynamic equilibrium that pure silicon is an extremely effective getter for oxygen and can remove it from water, oxygen, carbon monoxide, and carbon dioxide. The formation of multiple thin oxide layers coupled with further deposition of silicon may trap gases such as hydrogen within the growing bead. The silicon/silicon oxide boundaries serve as diffusion barriers to the outward diffusion of the hydrogen. This may be particularly a problem with the smaller particles since once the hydrogen is trapped in the very center of the bead it has to pass many diffusion barriers in order to exit from the particle.

A further dust-related problem encountered in production of silicon beads has been the large amount of dust that accompanied the beads. These dust particles are very small with a high surface area and therefore extremely prone to contamination. Gautreaux in his U.S. Pat. No. 4,883,687 recommends two modes of operation: fast and slow deposition. In the fast mode a high concentration of silane (about 10 mol % in hydrogen) is fed to the reactor, generating large amounts of dust which adheres to the surface of the silicon beads forming the fluidized bed. A slow mode follows where a low concentration of silane (1 to 5 mol % in hydrogen) is fed to the reactor, effectively sealing the adhered dust layer with a layer of polycrystalline silicon, thus preventing the dust from escaping the reactor. Having to switch to a slower mode of deposition reduces throughput of product silicon, increases operating cost, and increases contamination from diluents.

The problem of hydrogen contamination of silicon beads was addressed by Boone and Allen at Ethyl Corporation in their European Patent, EP 0 377 900 A2, and a U.S. Pat. No. 5,242,671, respectively, where they provide for a separate dehydrogenation reactor expressly for the removal of hydrogen from their beads. Another approach taken by Kajimoto et al. at Osaka Titanium, U.S. Pat. No. 5,037,503, put the dehydrogenator on the crystal puller for the same purpose. Should this not be done, a certain fraction of the beads will explode on heating, causing portions of the bead, carrying some liquid, to be spattered around the crucible. This popcorning effect is extremely undesirable and results in the inability to sell polycrystalline silicon that exhibits this behavior, hence the need for the additional dehydrogenation reactor. Provision of such an additional external reactor is, of course, expensive because the additional reactor must be provided and operated, the beads must be brought back up to temperature, and fluidizing gas must be brought up to significant temperature. The temperature of the dehydrogenation is typically 850° C. to 1100° C. There is, of course, the possibility of additional contamination of the beads during this dehydrogenation process, especially on the surface.

Recognition of two phenomena, silicon crystallization and granular filtration, allows for most of the problems with the prior systems in this area to be turned from problems into advantages. First, in a paper by A. M. Beers et al., "CVD Silicon Structures Formed by Amorphous and Crystalline Growth," *Journal of Crystal Growth*, 64, (1983) 563–571, it is shown that at high growth rates, the temperature of deposition must be high to allow crystallization to keep up with deposition. For rapid crystallization and growth rates on the order 2 to 3 μm/min, which are desired at the bottom of this type of reactor, the bead temperature must exceed 800° C. to get crystalline growth without hydrogen. For temperatures below 720° C. there will be amorphous growth with hydrogen bonded to it, and between these temperatures there will be amorphous growth without hydrogen. Operation of the deposition reactor at a high enough temperature avoids the need for a second dehydrogenation reactor or device. Second, amorphous particles formed in the gas phase can be filtered out in a tall bed using fluidized granular filtration at high temperature. The captured amorphous silicon then recrystallizes at temperatures above 700° C. for low deposition rates and long residence times, becoming an indistinguishable part of the polycrystalline silicon bead.

Another function of high temperature is to ensure that the particles are sufficiently sticky so that small amorphous silicon dust particles, once attached to the larger bed particles, cannot then be removed and contribute to dusting on removal of the bed. This will avoid the need for multiple process phases and additional equipment.

By keeping the temperature of the beads in the inlet zone above 800° C., and keeping them at that temperature by the novel heat transfer methods described below, the silicon that deposits on the beads will be polycrystalline with low hydrogen content. In the past it has been erroneously assumed that if the silicon-bearing gas decomposes, crystalline silicon will deposit on the beads. The beads in prior systems have been too cold because even if the bulk bed temperature has been on the order of 700° C., the cooling of the distributor plate or injector to avoid decomposing the silicon-bearing gas has lowered the temperature of the beads at the location of highest silicon-bearing gas concentration to between 400° C. and 600° C. This is so low that hydrogen is bound to the silicon and the silicon is deposited in amorphous form: brown and dusty instead of a bright, shiny, silvery color. These are the beads that leave the reactor, necessitating dehydrogenation and dedusting.

With the short beds at the low temperature used in prior systems, such as Poong et al.'s 48 mm ID×1000 mm tall reactor at 700° C. described in U.S. Pat. No. 4,900,411, the powder escapes the bed before being filtered.

In the improved design of the present invention, the tapered zone and the reservoir zone act as granular filters with sticky beads capturing the amorphous silicon dust as it travels up the reactor with the gas. Stickiness is also discussed below. Since the amorphous silicon powder will be captured and recrystallized, the reactor can be operated at high silicon-bearing gas concentrations and at high temperature without fear for loss of reactor efficiency.

A further process is provided for dealing with routine trace emissions of unreacted silicon-bearing gas (which are expected to be very small) and loss of fine amorphous silicon particles from the reactor which, as noted above, will depend primarily on the efficiency of the granular filtration in the tapered and bead reservoir sections. The concentration of reactive silicon-bearing gas and amorphous silicon powder can be controlled by injection of a halogen-containing gas into the effluent piping so that the resulting silicon-hydrogen-halogen ratio is such as to etch silicon at the temperature and pressure present in the piping. Such etching will remove most or all of the amorphous silicon powder and form halogenated gases such as silicon tetrachloride, silicon trichlorosilane, dichlorosilane, etc., or other gases depending on the halogen-containing gas injected. The injected gas could be chlorine, hydrogen chloride, silicon tetrachloride or their equivalents in other halogens. Such gases can then be routinely redirected and recycled through the system to other portions of the plant. Alternatively, they may be vented and scrubbed by appropriate techniques. Choice of the halogen-containing gas will normally be dictated by considerations of overall plant process integration and mass balance.

Blocher et al. at Texas Instruments, U.S. Pat. No. 4,117,094 noted the formation of explosive polymeric silicon chlorides of the general formula $(SiCl_2)_n$ and of means of avoiding them by lowering the temperature. Addition of halogen-containing gases for etching amorphous silicon can also avoid the problems of these polymers by choice of silicon-hydrogen-halogen ratios and temperatures in the downstream system. Such calculations can be made by one knowledgeable in the calculation of chemical equilibrium, by minimizing the concentration of $SiCl_2$ monomer in the gas phase. In general, the temperature will be controlled between 450° C. and 750° C. to improve the equilibrium while maintaining rapid conversion.

A further process is provided for controlling the reaction rate in the lower portion of the bed, gettering oxygen-containing materials to avoid formation of an oxide film on the particles, and modifying the inlet gas properties such as the viscosity and density, which in turn affect the particle Reynolds number, $Re_p$, which will be discussed below. This process consists of the injection of a halogenated silicon-containing gas, such as silicon tetrachloride, or halogen-containing compounds that will react with the silicon-bearing gas to form halogenated silicon-bearing compounds, in low ratios: 0 to 5 mole percent of the inlet gas stream. The reaction rate is controlled by modification of the intermediate species in the deposition, such as substitution of $SiCl_2$ for $SiH_2$. The presence of $SiCl_2$ is acceptable at the bottom of the reactor because it will be consumed quickly as a reaction intermediate and will not leave the bed. The formation of hydrogen diffusion barriers is prevented by gettering of any oxygen-containing materials through the formation of silicon oxide particles in the gas phase. This will avoid formation of a continuous silicon oxide film on the particles since the silicon oxide dust will be incorporated as a particle, not as a film. Injection of such a high molecular weight gas as silicon tetrachloride will increase the viscosity and density in the reactor that may be beneficial in terms of fluidization.

Another related process uses similar halogen-containing gases at the end of the desired operational run to remove silicon wall deposits. In such a situation, the timing of the injection of the halogen-containing gas is particularly important. As noted above, many gases, such as hydrogen, commonly used in fluidization contain oxygen-bearing materials which can react with the silicon in the reactor and form silicon oxide barrier layers. Thus, at the end of the reactor run where it is desirable to shut down the reactor, it is important that no oxygen-containing materials be allowed into the reactor before the injection of the halogen-containing material which will etch the silicon. This is because of the difference in etch rate between silicon and silicon dioxide, which is typically at least ten to one, with the silicon preferred to the silicon dioxide.

A major benefit of silicon beads compared to silicon chunks is the potential for continuous addition of beads to crystal pullers. Feeding beads continuously at the correct rate is much easier if the beads are spherical and of nearly the same size. Sphericity and particle size distribution have not been addressed directly in the past. Beads have tended not to be very spherical and to have a wide particle size distribution. The smaller beads are even less spherical than the larger beads. To produce spherical beads from seeds that are bead fragments, a self-correcting mechanism is needed to selectively deposit the silicon on the less-rounded or oblate portions of the bed particle. As the silicon deposits on the oblate side, that side will become more rounded and will then rotate to coat another flat section.

Such a self-correcting mechanism can be described mathematically by application of aerodynamic theory and knowledge of the preferential deposition zones. Becker, *Can. J. Chem. Eng.*, 37, 85–91 (1959), cited in *Perry's* 6th, pp 5–64 to 5–65, especially Table 5–21, reports the free-fall orientation of particles which is controlled by the particle Reynolds number. For particle Reynolds numbers between 0.1 and 5.5 all orientations are stable when there are three or more perpendicular axes of symmetry. When particle Reynolds numbers are in the range of 5.5 to 200, the orientation is stable in the position of maximum drag. For particle Reynolds numbers above 200 the orientation is unpredictable, however, particle Reynolds numbers this high are usually not observed in silicon deposition reactors. The desired regime, then, is where the particle Reynolds number is between 5.5 and 200 since the position of maximum drag is that in which the greatest cross-sectional area is presented perpendicular to the gas flow, that is, the flattest side facing the flow. Operating in this range enhances the sphericity of the product particles.

Deposition (mass transfer) occurs primarily on the forward side of the particle, highest at the forward stagnation point, diminishing around the particle to a minimum of about 25% of the maximum at about 105° C., then increasing again to about 50% of the maximum at the rear stagnation point per the work by Garner and Suckling, *A.I.Ch.E.J.*, 4, 114 (1958), cited in Zenz and Othmer, pp 467 and 468, especially FIG. 14.2. This, too, is desirable for self-correcting deposition.

The work for both of the references for the aerodynamics and the mass transfer was for single particles in a gas stream, strictly speaking. However, inspection of the curves relating the Colburn factor for mass transfer to the particle Reynolds number for single particles and comparing it to that for fluidized beds (see Zenz, FIGS. 14.1 and 14.7, respectively) reveals that, in the range of interest and given the spread in experimental data, the single particle predictions adequately describe the situation in the fluidized bed.

The gas viscosity does not change very much between silicon-bearing gases and inerts, although some gases, such as argon, are more viscous by their nature. Gas density, on the other hand, is a direct function of the molecular weight and pressure and an inverse function of the temperature, so it will change significantly between silicon-bearing gases and inerts such as hydrogen and argon. Since the gas density is a function of the pressure it will always be higher at the bottom of the reactor for a given temperature. Gas density can be controlled to a degree by modulation of the back-pressure on the reactor and the bed height. The velocity is a multiple of the minimum fluidization velocity, $u_{mf}$, which is also a squared function of the particle diameter, a difference function of the particle and gas densities, and an inverse function of the viscosity.

By use of the tapered wall and its subsequent effect on gas velocity and the resulting segregation of particles by size, the particle Reynolds number, $Re_p$, can also be controlled to some degree within the reactor. It is most important to have spherical particles exiting the reactor, therefore, higher particle Reynolds numbers are most desirable near the bottom of the reactor. High gas velocity, large particles, and dense gas will increase the particle Reynolds number; a very viscous gas will decrease it. For purity reasons it is best to inject only silicon-bearing gases into the reactor, so injection of a high density silicon-bearing gas that will remain dense as it traverses the reactor is desirable. A high density inert gas or a halogenated acid gas that will react to form a silicon-bearing gas may be used if a high density silicon-bearing gas is not practical.

The choice of silicon-bearing gas and the amount and species of diluent will affect the minimum particle size for which this self-correcting effect will work. Common choices in order of decreasing efficacy are:

| Species | Formula | Mole/Wt. | Viscosity (μP @ 850° C.) |
|---|---|---|---|
| silicon-bearing gases: | | | |
| silicon tetrabromide | $SiBr_4$ | 347.72 | 395.0 |
| tribromosilane | $SiHBr_3$ | 268.82 | 419.0 |
| silicon tetrachloride | $SiCl_4$ | 169.90 | 315.4 |
| trichlorosilane | $SiHCl_3$ | 135.46 | 348.5 |
| dichlorosilane | $SiH_2Cl_2$ | 101.02 | 327.2 |
| silane | $SiH_4$ | 32.12 | 333.5 |
| diluents: | | | |
| argon | Ar | 39.95 | 555.2 |
| helium | He | 4.00 | 467.3 |
| hydrogen | $H_2$ | 2.02 | 211.7 |

The worst combination for spherical beads is silane diluted with hydrogen, especially since more hydrogen is produced as silane decomposes. The top of the reactor would likely be nearly 100% hydrogen in that case and a well-mixed bed would be expected to produce very nonspherical small beads mixed in with more spherical larger beads. To obtain a more spherical product, it is important to segregate the small particles out of the bottom zone as well as to select operating parameters such that the particle Reynolds number is between 5.5 and 200 in the area of high deposition. Design of such a system given the above information is straight forward for one knowledgeable in the art.

Another unrecognized difference between the basic carbon technology and silicon technology is the difference in properties of the carbon and silicon at their respective deposition temperature. The deposition temperature of cokers is normally 455° C. to 538° C. (850° F. to 1000° F.), whereas decomposition technology for silicon varies between 600° C. and 1200° C., i.e., considerably higher temperatures. At the operating temperatures of a typical coker the carbon particles are inherently not sticky because the carbon is too cold. The temperature at which a material becomes sticky is called the Tammann temperature and can be approximated as 52% of the absolute melting temperature. Thus, for silicon with a melting point of 1410° C., the Tammann temperature is approximately 602° C., i.e., right at the range at which almost all silicon deposition patents have indicated as the minimum temperature. Carbon, on the other hand, has a melting (sublimating) point of 3550° C., thus a Tammann temperature of 1715° C., which is significantly above the temperature at which most cokers and pyrolytic carbon deposition units operate. This temperature is also well above the operating temperature of most polycrystalline silicon reactors. Therefore, carbon deposition is inherently nonsticky, but silicon deposition is inherently sticky.

The chemistry is also very different between carbon and silicon, with the important differences being that the oxides of silicon are solid while those of carbon are gaseous and that silicon is a metal that can form alloys and compounds with other metals while carbon forms organometallics or carbides. Both carbon and silicon can reduce metal oxides such as iron, nickel and chromium oxide typically found on the surface of most materials of construction suitable for high temperature such as stainless steel and nickel. Thus a silicon deposit formed on a metal will react with the underlying metal oxide to form silicon oxide (silica) and metal. The metal can diffuse through the silica into the silicon to form silicides, which in turn diffuse through the silicon. The silicon thus forms a very strong chemical bond with the underlying surface and allows migration of metals through it. In contrast, the carbon oxides formed on reduction of metal oxide leave as gases.

Once these differences are understood, it is not surprising that great practical difficulties have been encountered in the use of technology developed for catalyzed organic reaction and carbon deposition in silicon deposition applications. Particle stickiness will have an effect on plugging at the distributor and on agglomeration of the particles within the bed should the particles cease to move at sufficient speed that they bounce off one another. Also, bed internals will inherently be covered by a sticky material that will adhere to the reactor. In contrast, the carbon reactors will have non-sticky deposits which may be attritted by movement of the particle or easily removed on shutdown. By virtue of the lack of stickiness, the particles will tend not to adhere to the walls of the reactor nor to each other. In contrast, a solid silicon wall deposit, firmly adhered to the wall, forms in silicon fluid bed reactors, which will tend to damage the walls on cool down or if metal walls are used which are stronger than the silicon, the silicon will flake off, carrying metal contaminants with it This is particularly a problem in high purity silicon deposition because of the very low metal specification, which is on the order of 10 parts per trillion (ppt). The formation of potentially contaminating wall deposits, together with the high temperature and the use of halogenated gas materials, rules against the successful use of standard chemical processing industry metal technology for construction of the reactor and associated valves and piping. This was recognized early by Ling, U.S. Pat. No. 3,012,861, and reiterated by Ingle et al., U.S. Pat. No. 4,416,913, among others, who recommended the use of high purity quartz as a reactor material. The advantage of quartz is it is exceptionally pure and is, of course, silicon oxide, thus any contamination of quartz will add silicon and oxygen rather than metals. The current specification for oxygen is in the low parts per million range. Oxygen is present as a native oxide on the surface of all silicon, especially those surfaces that have been exposed to air. Other materials of construction taken from the pyrolytic carbon industry were variations on graphite such as silicon carbide coated graphite or sintered silicon carbide, which both suffer similar contamination migration problems.

A major problem of prior systems has been plugging of the distributor, reducing the capacity of the bed, and requiring shutdown for repair or replacement, and frequently breaking the reactor. Efforts to control this problem have included cooling the distributor as described by Iya in U.S. Pat. No. 4,684,513 and by Poong et al. in U.S. Pat. No. 4,900,411. A similar problem has been deposits of silicon on the wall of the reactor, addressed by temperature cycling described by Setty et al. in U.S. Pat. No. 3,963,838 and by cooling of the wall described by Poong et al. in U.S. Pat. No. 4,900,411. These efforts lead to significant thermal inefficiencies for the reactor system and a significantly (four times) larger microwave generator for the same polysilicon throughput.

In fluidized beds generally, bubbles form at the tip of the submerged jet or jets and these bubbles then form a bubbling fluidized bed in the area above the submerged jet(s) if the zone is designed in such a way to ensure the formation of bubbles. These techniques are known to those knowledgeable in the art and involve the calculation of the minimum fluidization velocity, $u_{mf}$. If this velocity is exceeded, then the area of the bed will be fluidized, the particles will tend to move about as a group, and, should the velocity be sufficiently in excess of the minimum fluidization velocity, then the particles will not stick together.

No internal devices of any kind are required within the reactor of the present invention, therefore, there is no possibility of deposition on such internal devices. For example, there is no particle support distribution plate on which silicon may be deposited or various agglomerations may start to grow so there is no need for cooling such a plate with its consequent thermal inefficiencies. Silicon-bearing gas enters the bed at a single nozzle at the bottom of the reactor. Thus, it is possible to utilize a variety of heating systems to provide the required heat for such a reactor.

As noted previously in discussing Iya's U.S. Pat. No. 4,684,513 and Poong et al.'s U.S. Pat. No. 4,900,411, it is desirable to heat the seed and bed particles to a higher temperature than the reactor wall to reduce wall deposits. Both Iya and Poong et al. did this by heating the bed then actively cooling the wall.

Heating the bed to a higher temperature than the wall is most conveniently done by providing much of the heat at or close to the interface of the cool inlet jet with the hot silicon beads. This concentrates the heat in the bottom of the reactor where the incoming gas has a large heat requirement in order for it to be heated up to the operational temperature of the reactor. The beads quickly heat up the incoming gas, but are cooled themselves and must be reheated. It is desirable to reheat the beads as close to the jet as possible to keep the bead temperature high in the jet area where the silicon-bearing gas concentration is highest and most of the decomposition and deposition take place. It is important to avoid overheating the incoming silicon-bearing gas prior to its contact with the hot beads to minimize wall deposits in the gas inlet.

Prior patents have used microwaves with active cooling of the walls to obtain some penetration of the microwaves through the silicon wall deposit, but the cooling results in inefficient use of energy. Attempts to reduce the cooling result in a runaway situation of higher wall temperature and greater absorption of the microwave energy by the wall deposit as the temperature increases, which leads to a further increase in wall temperature and to increased wall thickness from an increased reaction rate near the wall. This phenomenon of higher absorption at higher temperatures is caused by the decrease in penetration of the microwave energy through the wall deposit as the electrical conductivity of the silicon increases with the increase in temperature.

The innovation of the present invention in this regard is to inject the required energy up the gas inlet to the reactor in such a way as to heat the beads without overheating the silicon-bearing gas. This can be done by using a focused beam of electromagnetic energy of such a frequency distribution that the silicon-bearing gas is transparent to most of the energy but the silicon beads effectively absorb the energy. The spectra of the silicon-bearing gases and polycrystalline silicon are known or can be measured so that the frequencies at which the gases absorb can be avoided while the energy is absorbed by the silicon beads. For example, a carbon dioxide ($CO_2$) laser emitting at 10.6 microns can be used in a trichlorosilane reactor but not in a silane reactor because silane absorbs electromagnetic energy at this frequency. A neodymium yttrium aluminum garnet (Nd:YAG) laser emitting at 1.064 microns can be used with either trichlorosilane or silane. While lasers are easy to direct and have a narrow frequency distribution, they are relatively inefficient and expensive to purchase and operate. Another approach is to use one or more high intensity quartz-halogen or xenon lamps with appropriate reflectors, filters, and lenses. These typically have high efficiency (25 to 40%) and are inexpensive, but have short lives, on the order of 400 to 1000 hours. Thus, an arrangement is needed so that the lamps can routinely be changed out without disrupting the operation.

For silane it is possible to provide the heat chemically by reacting the silane or silicon beads with chlorine or hydrogen chloride. Approximately 2.5% of the silane flow will react with chlorine to provide sufficient heat to heat the silane from 400° C. to 850° C. The addition of halogenated silicon compounds is discussed elsewhere with respect to control of the reaction rate and gas viscosity. It is also useful in keeping the injector tube tip clear for the addition of electromagnetic energy, as well as preventing growth of wall deposit near the silicon-bearing gas inlet. Thus, addition of the elemental halogen provides the additional benefit of providing the reaction heat.

Further up the reactor the gas and beads are both the same temperature, so the only heat requirement is that needed to offset heat losses through the wall of the reactor. This heat requirement can be provided by any convenient source, which is usually the same as that provided for initial heat up.

The distribution of this heat can thus be designed by one knowledgeable in the art once aware of the different circulation patterns within the reactor. In the conventional fluidized bed, which is fully mixed, the heat input may be located conveniently at any location within the reactor as the reactor is fully mixed and the heat will be transferred by the particles quite readily. In fact, it is exceptionally difficult to establish a temperature gradient within such a well-mixed reactor. In the present invention, where there is more than one zone, it is possible to provide heat where it is required to establish the temperature gradient needed for optimal reactor performance. Thus, a temperature gradient may be established without the high energy penalty of prior systems.

Such calculations can be made by one skilled in the art by utilizing the fact that the upper bead reservoir, which is designed with a positive velocity profile, will be well mixed, that the tapered section with a negative velocity profile will function as a plug flow reactor such that the particles proceed downward essentially as a fluidized plug, and that the bottom section around the inlet jet will also be well mixed. The number of particles entering the inlet zone from the tapered zone will equal the number of particles exiting the tapered zone, less the number of particles broken up to form seeds. The number of particles exiting that zone as product can be calculated from the desired product rate and the desired product particle diameter. Similarly, the number of particles entering the top of the tapered zone will equal the number of particles leaving the bottom of the tapered zone, for all practical purposes. Thus, given the desired bed temperature profile, the required heat input at each location can be calculated.

For example, if a flat temperature profile is wanted, it will be necessary to put most of the heat in at the inlet zone where the gas is brought up to temperature, then simply provide sufficient external heat to the upper zones to offset the heat losses through the wall. The heat losses from the wall can be significantly reduced by utilizing an "air gap" via dual wall construction, and by use of thermal insulation, such as alumina/silica fibers, which is transparent to microwaves but provide high resistance to the transmission of heat, i.e., has low thermal conductivity. The combination of the dual wall plus the insulation is desirable because the insulation is a source of contaminants, such as sodium, which can travel through quartz. Use of a dual wall also allows use of a purge flow of gas to sweep the sodium and other contaminants out of the gap. The drop in temperature across the air gap also reduces the peak temperature of the insulation, which then reduces the vapor pressure and vapor phase concentration of contaminants in the insulation itself. The purge flow can also be continuously sampled for traces of reactor gases that might indicate a leak. A further safety function of the purge flow is to sweep out hydrogen, which permeates through quartz.

It is possible to allow for some active cooling of the reactor wall and thus provide a greater temperature profile across the wall as suggested by Poong et al. Since deposition of silicon on the wall is known to be related to the difference in temperature between the bed and the wall, such cooling may be desirable in controlling the thickness of the silicon deposit in conjunction with the concentration gradients and fluidization state mentioned previously. Cooling of the reactor wall can be done without significant increase in heating requirements by taking advantage of the different requirements along the length of the reactor. At the bottom of the reactor where the concentration of silicon-bearing species is high, a relatively cooler wall reduces the thickness of the silicon wall deposit in an area where it is otherwise very likely to be thick. At the top of the reactor where the concentration of silicon-bearing species is low, it is more desirable to have a wall temperature as high or higher than the bed so that the silicon will form a protective deposit on the wall.

It is possible for one skilled in the art of heat transfer to employ the above purge gas flow between the reactor wall and an outer wall or shroud to generate the desired temperature profile of the wall. By such use of temperature distribution and other techniques discussed hereafter it is feasible to control the thickness of the silicon wall deposit without providing substantial cooling and consequent large increases in energy consumption. In such a scheme, the heating through the wall, either by microwaves or conventional heating, would be focused more at the bottom of the reactor and the upper reactor temperature would be allowed to drop relative to the outside wall. Iya and Poong et al. have suggested actively cooling the wall to avoid the presence of any silicon deposit at all, but this results in extremely high energy input relative to that obtainable by insulation of the wall and avoidance of active cooling. Also, erosion of the wall by the fluidized bed would result in erosion of wall material rather than silicon, which could lead to contamination of the product. The silicon layer on the wall provides a high purity barrier between the high purity silicon beads and the reactor wall, which, although high purity material, is not the high purity silicon of the beads or a wall deposit, and will contain impurities that may be deleterious to the product. Thus, a thin wall of silicon is desirable as a barrier on the reactor wall. Skill is required, however, to maintain or control the thickness of the silicon wall deposit.

Other methods of reducing wall deposition are to keep silicon-bearing species away from the wall and to reduce the heat transfer to the wall from the bed. In the inlet zone where the circulation is induced by the jet, the wall is protected by a downward moving screen of beads. In the tapered zone the bed operates in a bubbling regime where the bubbles are smaller than the reactor diameter. In the upper bead reservoir zone, slugging conditions are permitted in order to form a protective silicon wall deposit in areas of low silicon deposition rates and relatively high erosion.

In a typical shutdown scenario, the silicon-bearing gas concentration and the bed height would be progressively reduced and compensated by an increased flow of fluidizing gas. Just prior to the shutoff of the silicon-bearing gas flow (which is in itself an effective getter of many oxygen-containing species), the halogen-containing material is injected as described previously to etch the reactor before cooling in order to avoid breakage. This technique ensures that an oxygen gettering gas is always present inside the reactor. Avoidance of an oxide film gives faster etching of the silicon wall deposit inside the reactor and prevents the formation of fine filamentous streamers of silica inside the reactor, which must be removed prior to restarting of the reactor.

In the event that this approach may not be feasible for whatever reason, a further approach can be used in which another bed of silicon or other material is put into the reactor after the valuable product material has been withdrawn. This bed is then used to agitate and abrade the silicon oxide layer formed on the silicon wall deposit. The latter approach is not preferred, but is feasible in the event of an unplanned shutdown where the halogen-containing material was not injected on a timely basis.

A further problem of prior systems is the failure to recover sufficient heat from the reactor to heat the incoming gases up to the inlet temperature, typically 350° C. to 450° C. Such heat recovery can reduce heating and cooling requirements and thus reduce operating costs.

A process to cool the large product beads as they are removed is provided using the heat in the beads to preheat the incoming silicon-bearing gas, thus reducing the overall energy demand on the process. This technique can be implemented using an annular heat exchanger disposed around the inlet of the reactor. More specifically, a center injector tube carrying the silicon-bearing gas is placed inside the inlet nozzle of the reactor. In the annulus around the center tube a stream of beads is continuously removed in a way that avoids adhesion or agglomeration of the beads and to transfer heat to the incoming silicon-bearing gas.

In particular, the design of the inlet silicon-bearing gas nozzle is very important in preventing deposition of silicon inside the nozzle while allowing heat transfer to the silicon-bearing gas from the outgoing bead. Such a nozzle can be designed by using a double wall structure such that a gap, which may be vacuum or backfilled with inert, reduces the heat flux from the outside beads through the wall into the silicon-bearing gas. This should keep the inner wall temperature below the decomposition temperature of the silicon-bearing gas, thus preventing a silicon wall deposit inside the inlet tube. For silicon-bearing gases that thermally decompose, this temperature is in the range of 400° C. to 600° C. It is advantageous from a heat transfer point of view for the wall temperature to be as high as feasible without incurring deposition. This is most conveniently arranged by varying the distance of the "air" gap. Where the "air" gap is larger at the top of the exchanger, the heat transfer from the hotter beads on the outside is slowed in such a way that the inner wall temperature can remain constant, thus maximizing heat transfer to the silicon-bearing gas and maximizing cooling of the beads without initiating deposition on the wall.

It is advantageous after a certain length, when the beads have cooled down to approximately 500° C., to discontinue the double wall approach and thus allow a faster rate of heat transfer than would have been feasible if a double wall had been continued. It is feasible to design a reactor without a heat exchanger or to design it so that the beads are not cooled by using a larger gap and continuing the gap for a longer period. Such an approach may be desirable if an additional bead processing step is desired underneath the deposition reactor in which the bead temperature is needed to be maintained at a relatively high temperature.

An alternative design to maintain overall energy efficiency of the system is to preheat the incoming silicon-bearing gas with the outgoing gas from the top of the reactor.

Using the outgoing stream requires a larger surface area heat exchanger such that it is not particularly practical to design it as an integral part of the reactor. Thus, the silicon-bearing gas temperature entering the reactor must be higher with possible difficulties in sealing the inlet joint because of the high temperature. This design is best for silicon-bearing gases where the heat content of the product beads is insufficient to raise the inlet temperature to the desired temperature.

The relative heights of the zones of the reactor can be designed by one knowledgeable in the art by following the basic rules that apply to such zones. For example, in the inlet zone it is desirable for the height of the inlet zone to be approximately equal to the height of the spout, or inlet jet, so that the top of the spout is close to the top of the inlet zone. The height of the spout can be predicted by various equations in the literature, the most useful one of which is termed the Jet Penetration Length by Zenz. This model has the advantage of taking into account the difference in gas properties that may be seen in changing between the various silicon-bearing gases.

Above this inlet zone is a zone, which can be cylindrical but is best tapered, that provides particles that can drop into the inlet zone, be coated with silicon, then exit the reactor. The small seed particles formed in the jet are directed upwards as they are formed, being entrained with the gas. They then go up into the bead reservoir where they grow as described below.

The height of the tapered zone is designed to provide sufficient length and separation capability to achieve the desired segregation for the particle size distribution required in the ultimate product. It can be expected that this will be at least equal to the height of the inlet zone, although it may be as much as two to ten times that height.

The bead reservoir zone is designed to serve two purposes: first, to provide a large reservoir of beads one to ten times the volume of the two lower zones combined to provide stable operation of the overall reactor against any upsets in the system, and second, to provide effective collection of small diameter amorphous silicon particles. One knowledgeable in the art can design such a zone to function as a fluidized bed granular filter utilizing standard techniques.

In general terms, the taller the bead reservoir zone and the smaller the beads, the more efficient is the filtration of the fine amorphous silicon particles, thus, the more efficient the overall deposition of the system. Less powder loss means fewer downstream operational problems resulting from particle deposition and coating of equipment. On the other hand, there are greater capital costs in providing for the additional height of the reactor and some slightly greater operating costs because of the higher heat loss from a longer reactor and higher pressure drop due to the increased bed height. The overall height may well be set by such issues as manufacturability of the reactor and convenience in movement, transportation, and installation of such a reactor.

As noted, a further process can be provided underneath the reactor to provide additional processing steps as may be needed to modify the bead appearance and/or purity. A passage between the upper reactor and the lower product finishing chamber is used as a downcomer such that the beads fall at a steady rate into the lower chamber. Using pressure balance, it is feasible to feed other gases into the lower chamber then vent them without significant quantities of those other gases getting into the reactor. Such steps could be used for final removal of hydrogen, etching of the beads to reduce surface impurities that have migrated to the surface, recrystallizing the internal structure of the beads, or holding the beads at a higher temperature for a longer period of time for simple annealing.

To allow continuous removal of beads from the reactor with packaging into discrete containers a degasser and bead diverter have been devised. The degasser serves dual purposes: it removes the reactor gas from the bead flow before packaging and it controls the flow of beads out of the reactor. Beads that have been cooled by the heat exchanger on the bottom of the reactor travel in dense phase flow out of the heat exchanger into the degasser. The beads form a fixed bed in the degasser, which is designed to allow the beads to flow smoothly without dead zones. The walls of the degasser and bead diverter should be of a noncontaminating material. Non-silicon-bearing gas is pulsed into the gas port on the degasser in quantities, durations, and frequencies to move a prescribed quantity of beads into a subsequent vertical degasser tube or into the bead diverter. As the beads move down the degasser, the reactor gas is replaced with inert gas and vented out the top of the degasser while the beads fall through a separate inert gas stream rising from the bead diverter.

It is in the vertical degasser tube that bead flow and on-line particle size may be best measured and any surface treatment effected. Noncontact methods of solid flow measurement, such as weigh cells on the reactor and transfer vessels, volumetric measurement using graduations on a cylindrical transfer vessel, microwave levels, or ultrasonic levels may be used. There are also contact methods for measuring flow of solids, such as impact flow meters, although they require modification from commercially available instruments such that the contact surfaces be high purity silicon-based materials. The load cells must be totally enclosed and isolated, the body of the instrument made of quartz, and the strike plate made from an undoped silicon wafer. On-line particle size analysis is best done with a noncontact optical method, exploiting the transparency of the quartz wall. Surface treatment using high intensity light or lasers to smooth and round the surface is also noncontact, again exploiting the transparency of the quartz wall.

The bead diverter receives the silicon beads in a stream containing any of the reactor gases toward the top of a vertical or nearly vertical tube with an inert stripping gas introduced near the bottom of the tube. The beads fall as a dense or dilute phase through the inert gas, effectively stripping any remaining reactor gases from the beads, landing on a small pocket of silicon beads at the bottom of the tube. Various other tubes radiate out from the bottom of the vertical tube toward the vessels intended to receive the silicon beads. The inert gas is introduced into all the radial tubes except the ones where the vessels are filling, motivating the beads toward their intended destinations.

After a short radial shunt, the beads again fall through a vertical or nearly vertical tube through one or more gas-purged valves. These valves may be closed on the other radial tubes not passing silicon beads, or the inert gas may be passing through the valves if gas isolation is not required. The beads continue into the receiving vessel under the inert atmosphere until the vessel reaches an acceptable fill level, the gases going out through a pressure or flow controlled vent. When the fill level is reached, the inert gas flow is increased and the vent closed and another vessel is opened simultaneously or nearly simultaneously to divert the bead flow from the first vessel to the second. After a short time in which residual beads have fallen out of the vertical tube, the gas-purged valves are closed and the purge rate increased to maintain internal pressure so that the vessel can be disconnected for transport to another location.

Therefore, it is a main object of the present invention to provide a low cost, efficient, fluidized bed reactor system for the production of high purity polycrystalline silicon in granular form in which the product beads are uniformly large, shiny, round, and free of hydrogen, dust, and other contaminants. In the process seed particles are not added to the bed, but are instead generated inside the bed without contamination. Also, segregation of large particles takes place inside the bed itself in dense phase.

Another principal object of the invention is to incorporate the amorphous silicon, generated through homogeneous gas-phase reaction, by recrystallization into the polycrystalline silicon product while avoiding incorporation of hydrogen, thus integrating hydrogen removal into the reactor design and avoiding the need for a second dehydrogenation reactor or device. In addition, the present invention provides a method for removal of the product silicon from the reactor without contamination of said product.

Other objects of the invention are to minimize the addition of non-silicon-bearing gases, provide a reactor system that eliminates the problems associated with the clogging of distributor plates without cooling said distributor, and produce a narrow particle size range in the product beads. Further objects are to avoid plugging of the downstream piping and equipment and to recover most of the heat needed to preheat the incoming gases.

A further object of the invention is to avoid the placement of internal structures within the reactor that will be prone to deposition of silicon-bearing materials and to manage or remove such silicon deposits as may be formed to avoid breakage of the reactor.

In summary, the present invention concerns a device and method for producing large, uniform, round, shiny, high purity polycrystalline silicon beads. The reactor is made of high purity silicon-containing material such as quartz and is defined by two or three zones: an inlet zone and a bead reservoir zone arranged vertically. In some embodiments, a third tapered zone is positioned between them. A shroud around the reactor acts as a contamination and thermal barrier. The inlet zone is about the same height as the diameter of the reactor and the jet formed by the inlet silicon-bearing gas entering through an inlet port at the bottom of the reactor. The tapered zone is about two or three times the height of the inlet zone, as required to achieve separation of the beads by size. The bead reservoir zone is at least three to five times the volume of the lower two zones.

The functions of the reactor are integrated, although some principally occur in specific zones. The inlet zone provides the internal seed generation as the jet grinds some of the large beads in this zone to form seed material, which then migrates up the reactor to the other two zones. The tapered zone with its negative velocity profile promotes the internal segregation in the dense phase needed to harvest silicon beads with large average particle diameter with narrow particle size distribution. Large beads go down in plug flow while the small beads and gas go up. Some deposition takes place in this zone by granular filtration and by CVD, although the silicon-bearing gas concentration is low. The bead reservoir zone provides residence time and space for granular filtration of the amorphous silicon formed in the inlet zone onto sticky beads at high temperature. Amorphous silicon is recrystallized at high temperature throughout the reactor, but especially in the bead reservoir zone, to form an indistinguishable part of the silicon beads. Some slugging occurs in this well-mixed zone.

The inlet zone has the highest concentration of silicon-bearing gas and the highest decomposition and deposition rates occur in this zone. Deposition by CVD takes place here, although much of the inlet silicon-bearing gas will decompose in the gas phase to form amorphous silicon. High circulation rates keep this zone well mixed. The beads are kept hot by injection of chemical or light energy directly to the jet through the gas inlet tube, said light energy is not absorbed by the gas, only by the solid beads in the jet. High temperature allows for deposition of the silicon in crystalline form without incorporating hydrogen, thus making unnecessary a separate dehydrogenation process. The beads are made round in this zone by controlling the gas density and particle size to keep the particle Reynolds number high enough that deposition preferentially takes place on the flattest surface of the bead.

Plugging is avoided by not having any internal structures, including a distribution grid. Halogen-containing gas is injected to digest residual silicon-bearing gas and excess powder at the reactor gas outlet at the top of the reactor where the gas is recycled back to the silicon-bearing gas production facility.

Beads are removed at the bottom of the reactor and cooled with the incoming silicon-bearing gas, which is thus preheated. Additional bead processing steps are permitted in the bottom withdrawal tube of the reactor such as further segregation, polishing, or annealing, as needed. Bead flow is controlled and the beads are stripped of reaction gas in the degasser. Beads are directed to transfer vessels by a bead diverter.

BRIEF DESCRIPTION OF THE DRAWINGS

In the drawings:

FIG. 10 is a vertical, cross-sectional, schematic view of an on-line particle measuring system.

FIG. 11 is a vertical, cross-sectional, schematic-view of a particle treatment system having a source of high intensity light for heating the surface of product beads.

FIG. 12 is a schematic diagram of a system for removing oxygenated compounds from diluent and/or inert gases.

DETAILED DESCRIPTION

Figure 1:
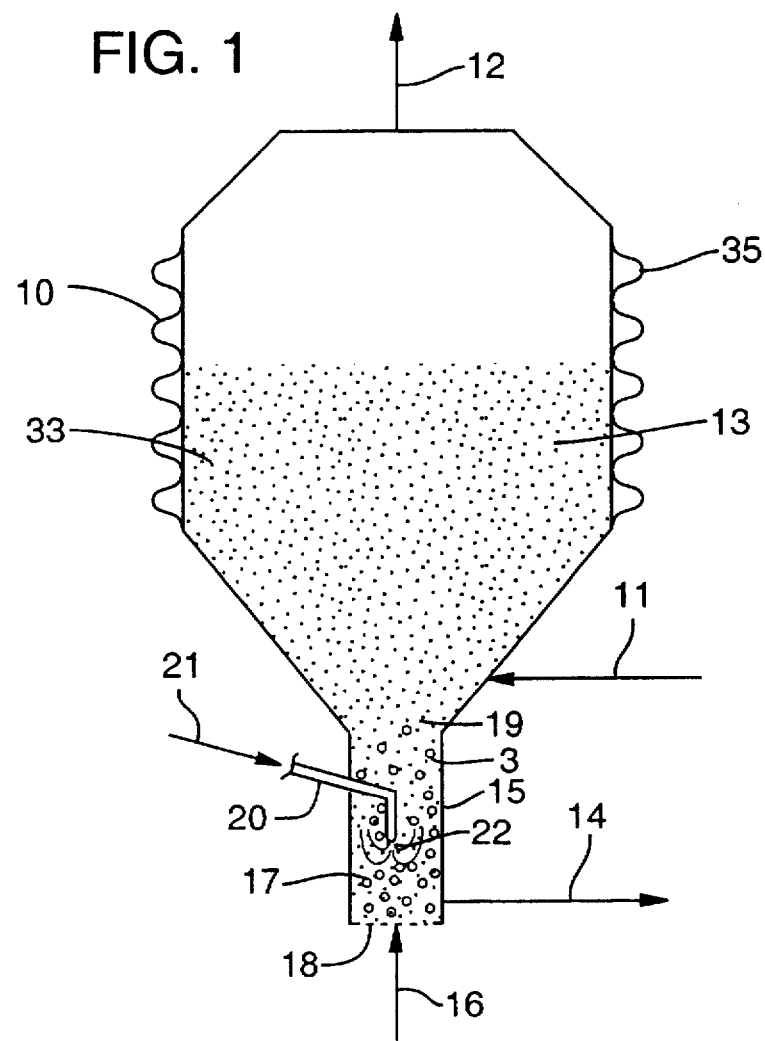
FIG. 1 is a vertical, cross-sectional, schematic view of a fluidized bed reactor for the production of silicon.

FIG. 1 schematically illustrates a prior silane reactor at 10 which processes ultra-high purity silane feed material entering the reactor at 11 to produce by-product hydrogen which exists at 12 and silicon product particles 3, which are recovered at 14. A pyrolysis reaction occurs in fluidized bed 13, in which are suspended silicon particles 33. The fluidized bed is heated by suitable heat source 35, to a temperature at which the silane decomposes to produce silicon which deposits on particles 33, in the fluidized bed 13, and causes silicon particles to grow and become enlarged. As the silicon particles in the fluidized bed become enlarged, they reach a size where they are no longer able to be fluidized and will descend from the fluidized bed into a boot separator chamber 15, which is designed to receive the enlarged silicon product particles 3 from the fluidized bed 13. Gas 16, e.g., hydrogen, is introduced through a perforated member 18 at the bottom of the boot separator chamber. The flow of gas 16 is controlled such that it will upwardly transport relatively small seed-sized particles of silicon, but will not interfere with the downward movement of enlarged silicon product particles. Small seed-sized particles will be transported through the top 19 of the boot separator chamber and enter the fluidized bed as seed particles. Such small particles will grow during the reaction in the fluidized bed and become enlarged and descend as silicon product particles into boot separator 15.

The method of generating seed particles includes the placement of a tube 20 into the boot separator chamber 15. A nozzle 22 at the end of tube 20 is aimed in a downward direction. A suitable fluid 21, which is preferably recycle hydrogen, but could be another inert gas such as argon or helium or even some of the feed silane, is then introduced through tube 20 and exits nozzle 22 as a high velocity jet pointing downward within the boot separator chamber 15. The fluid jet exiting nozzle 22 causes turbulence and some of the silicon product particles in boot separator chamber 15 are moved so as to impinge upon one another and thereby be comminuted into smaller seed-sized particles of silicon. The upward flowing gas 16 transports the generated seed-sized silicon particles upward and through the top 19 of the boot separator 15 into fluidized bed 13. The fluid jet from nozzle 22 causes the enlarged product particles in the boot separator 15 to be abraded and comminuted by contact with each other to generate seed-sized silicon particles. This technique eliminates any handling of the product and generates seed-sized material as needed directly below the fluidized bed.

The operation of this fluid jet silicon seed particle generator is preferable employed in a periodic fashion. That is, the fluid jet seed generator can be operated for a portion of the reactor operating time such as one-quarter to one hour to generate seed-sized particles for the fluidized bed in the reactor. The reactor can then operate on this seed material with the particle size of all the suspended material increasing and thereby generating larger particles which are suitable for removal as product 14. The product material can then be removed and another batch of seed material generated. The silane pyrolysis reactor itself would operate in a continuous mode with periodic removal of product material and periodic generation of seed material. Although not preferred, it is possible for the fluid jet generator to operate continuously in order to generate some seed material on a continuous basis. However, such continuous operation is not as attractive in terms of interference with removal of the silicon product particles 14. Preferentially, the fluid jet would operate for a short time to generate some fines. Those fines would then be fluidized and grown in the fluidized bed section, with larger particles being generated. Some of the larger generated particles would be removed as product and then seed material would be generated once again.

The gas velocities within the fluidized bed are usually related to the diameter of the particle and to the properties of the gas by a term known as minimum fluidization velocity and the velocities within the reactor are typically in the range of two to six times minimum fluidization. Operation at these higher levels of flow and two to six times minimum fluidization is usually required to prevent particle agglomeration and plugging of the particle support plate 26 which has significant problems which interfere with the continuous operation of the reactor. The plugging of the particle support plate is particularly troublesome because it ultimately will plug the entire reactor and form a large silicon deposit which is extremely difficult to remove. For most reactors constructed of high purity materials such as quartz or silicon carbide, this plug may well break the reactor on cool down.

The design of the removal tube 24 or boot separator 15 can be done in such a way as to provide an opposing gas stream which can serve the purpose of preventing the exiting of silicon-containing materials from the reactor that can be entrained in the exiting particles and also to attempt segregation of larger particles from smaller particles. Prior attempts at this rely on segregation in the removal tube, sometimes termed boot. This removal relies on the difference in settling velocity between small and large particles. However, it is a feature of fluidized beds that the particles tend to act as a whole rather than as individual particles and thus, unless exceptionally large quantities of gas are used such that the particles are substantially independent of each other, it is exceptionally difficult to obtain significant segregation in this way. Use of such large quantities of gas requires the recycle of pure hydrogen, but the facilities for such purification and recycle are expensive and contamination prone.

FIGS. 2-7 show a basic reactor system according to the present invention. The system includes a reactor vessel 101, a shroud 127, and an outer containment system 110. The reactor vessel has a wall 111 that defines a chamber 103 having plural zones to contain a bed of silicon beads 102. In the illustrated embodiment, these include an inlet zone 116, a tapered zone 118, a reservoir zone 120, and a disengaging zone 122. The illustrated tapered zone 118 and reservoir zone 120 are portions of a region that is referred to herein as the upper zone. The outer containment system 110 provides personnel protection from hot surfaces and is tertiary containment for the reactor and heating system from the surrounding environment. A shroud 127 serves as a contamination barrier between the heating system from the reactor and serves as secondary containment of leaks that may occur, should reactor wall 111 break for any reason.

Reactors according to the present invention have a heating system to heat up the bed 102 to operating temperature, to compensate for heat loss through the reactor wall 111, and to provide process heat to the incoming gases 113, 115, 143, to bring them to operating temperature. The beads inside the chamber need to be maintained at an operating temperature of at least 500° C. sufficient to cause silicon to deposit from silicon-bearing gas onto the beads. It can be seen from the following discussion that the choice of a heat source is related to its purpose, location, and the choice of material of construction for the reactor. The illustrated reactor heating system comprises jet heating devices, 141, 143 and wall heating systems 128, 129. Specific locations for heat input are the wall 111 of the reactor and a gas inlet passageway 130 defined by a gas inlet tube 131, which passageway 130 is positioned to deliver a silicon-bearing gas into the reactor via a fluidizing inlet 104 at the top of the tube 131.

Use of a jet heating device 141 and/or 143 extends the list of choices for reactor materials of construction. In systems without a jet heating device, a wall heating system must provide all the process heat to the incoming gas, which leads to greater heat fluxes, higher wall temperatures, and thicker silicon wall deposits as the reactor is scaled up.

Figure 2:
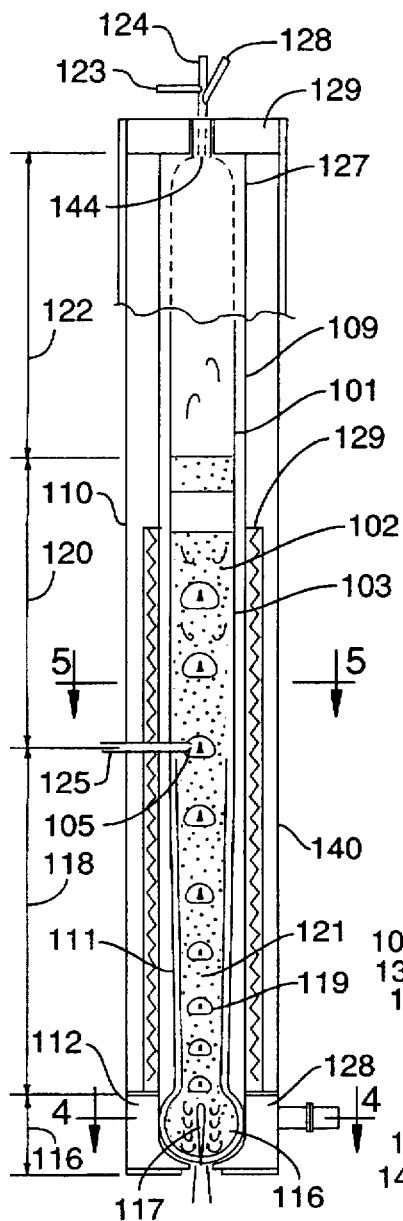
FIG. 2 is a vertical, cross-sectional, schematic view of a reactor according to the present invention.
Figure 5:
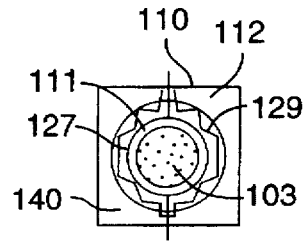
FIG. 5 is a sectional view taken along line C—C of FIG. 2.

The purposes of initially heating the bed and compensating for heat losses can be easily met by low cost, reliable resistance heaters 129 as shown in FIG. 2 and FIG. 5. These have the advantages of low capital cost for high startup power and large turndown for low operating cost.

Figure 4:
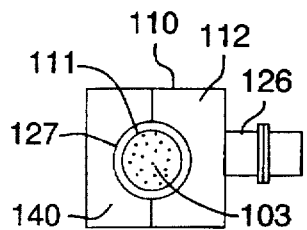
FIG. 4 is a sectional view taken along line B—B of FIG. 2.

The process heat requirement is at the bottom of the reactor. Best results are obtained when the beads in the inlet zone 116 are maintained at a temperature of 700° C. to 1200° C., during deposition of silicon on the beads, to reduce the hydrogen content of the beads and to promote polycrystalline structure throughout the beads. Resistance heating through the wall in this area is not a good choice because of high wall temperatures, but a microwave or infrared heat source 128 and jet heating devices 141 and/or 143 are good choices. Microwave heating 128 through the wall 111 may require active cooling of the wall 111 in the inlet zone 116 at the base of the reactor to achieve the desired penetration into the bed, but this may be cost effective in a localized area. Infrared heating does not penetrate into the bed like microwave heating, but is less complex and less expensive. Microwave and infrared heating are mutually exclusive at any given location. Jet heating is advantageous because heat is injected in the center of the reactor, but may be expensive to build and operate. Either a microwave or an infrared heating device 128 and either or both jet heating devices 141, 143 can be operated simultaneously in the embodiment shown in FIGS. 2 and 4. FIG. 4 shows a microwave zone system where the entire cavity 112 between the shroud 127 and the outer metal shell of the containment system 110 can be filled with insulation 140. This insulation should be substantially transparent to microwaves. It is known that insulation manufactured from a mixture of aluminum oxide and silicon dioxide will be effective for this purpose. The containment system 110, especially in the inlet zone 116, can also be actively cooled, such as with a water jacket.

In the upper zone 118, 120, resistance heaters 129 are directly located next to the shroud 127 with insulation 140 between the heaters and the outer shell 110 as shown in FIG. 5. The upper zone 118, 120 should be sized, shaped, and heated so that beads will be held in that zone at a temperature of 700° C. to 1200° C. for 1 to 24 hours to reduce the hydrogen content of the beads and promote polycrystalline structure throughout the beads. The best approach is to use resistance heaters 129 for the upper zone 118, 120 with an optimized configuration of jet heating devices 141 and 143 and microwaves from a microwave source 128 for the inlet zone 116.

A thermal conductivity detector (TCD), connected by a sample line to the annular space or cavity 109 between the reactor wall 111 and the shroud 127, can be used to detect any leaks of process gases from the reactor. If quartz is used as the material of construction for the reactor wall 111 and the shroud 127, which is best to achieve the heat transfer and purity goals, hydrogen will pass at an appreciable rate through the quartz at elevated temperatures. An inert purge, preferably nitrogen, can be used with a TCD to avoid unsafe conditions in the area surrounding the reactor. The purge gas can be handled by a gas circulation system (not shown) which flows the gas through the space 109 and thereby diverts and captures any external contamination flowing toward the wall 111 and any gas that escapes through the wall 111. The space 109 is in thermal communication with the wall 111 so any heat escaping from the vessel is also transfered to the purge gas.

Figures 6, 7:
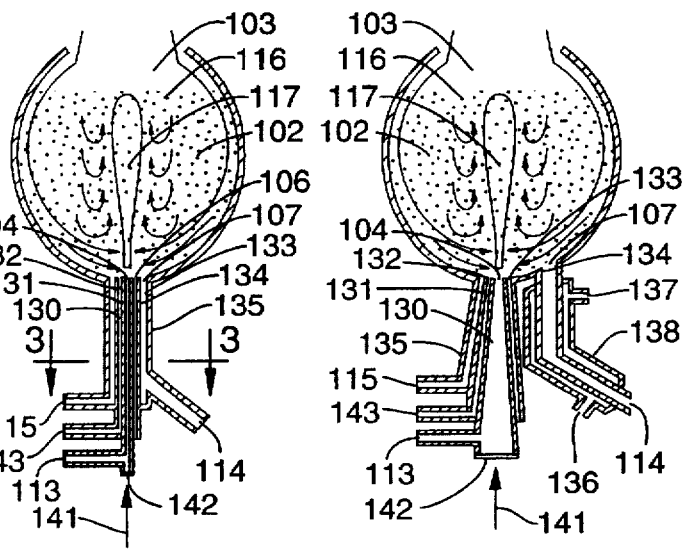
FIG. 6 is an enlarged vertical, cross-sectional, schematic view of the inlet zone, gas injector, and bead exit of the reactor of FIG. 2 with integrated heat exchange, the bead exit having a taper of $0°<A<65°$.
FIG. 7 is an enlarged vertical, cross-sectional, schematic view of the inlet zone, gas injector, and bead exit of the reactor of FIG. 2 with decoupled heat exchange, the bead exit having a taper of $0°<A<65°$.

The reactor vessel 101 can be made from any high purity silicon-containing material. The illustrated wall 111 is substantially one piece, although portions of the reactor may be made of more than one piece. A particular case where it is convenient to make the reactor in more than one piece is at the bottom of the reactor where the tubes for inlet gases 113, 115, 143, and a silicon bead removal tube 114 all come together. These tubes, including a tube 135 (219 in FIG. 8) which serves both as a gas inlet tube and as an outlet or bead withdrawal tube, may be conveniently fabricated separately and inserted into the reactor as shown in FIG. 6 and in cross-section in FIG. 3. As shown in FIG. 7, the bead removal tube 114 (with gas inlet 219 shown in FIG. 8) can also be separate from the inlet gas tube 135 in the event that it is not desirable to have heat transfer between the inlet gases 113, 143 and beads that exit through tube 114. Alternatively, it is possible to fabricate the entire assembly as one unit.

Prior to injection of silicon-bearing gas to fluidize the beads, it is desirable to remove any oxygen-containing contaminants, such as oxygen, water, and oxides of carbon, from the vessel and beads by reacting a halogen-containing gas with the beads and vessel wall deposit under conditions that favor formation of solid particles and that disfavor deposition of contaminant films on the beads or the vessel. This can be accomplished by injecting a halogen-containing gas 143, supplied from a suitable source, through inlets 104, 106 at the top of tubes 131, 132. The halogen-containing gas reacts with silicon-containing species on the beads of wall to form halogenated silicon-bearing gases which in turn react with contaminant films to form solid particles. The solid particles are swept out of the reactor by the gas flow. The halogen-containing gas may include a diluent gas that is a non-silicon-bearing gas such as hydrogen, argon, helium, nitrogen, or a mixture of such gases.

To accomplish silicon deposition, a silicon-bearing gas 113 is injected at a velocity sufficient to form a fluidizing jet 117 when it enters the bottom of the chamber 103 through the inlet 104. The silicon in the silicon-bearing gas can be in the form of silane compounds, halogenated silane compounds, and mixtures thereof. Suitable compounds include silane, disilane, dichlorosilane, trichlorosilane, silicon tetrachloride, tribromosilane and mixtures of such compounds. The silicon-bearing gas may also include a diluent gas that is a non-silicon-bearing gas such as hydrogen, argon, helium, nitrogen, or a mixture of such gases.

Favorable results are obtained when the vessel 101 and fluidizing jet 117 are sized and shaped so that particles at the bottom of the chamber 103 are oriented in the position of maximum drag, which position is indicated by the particle Reynolds number range of 5.5 to 200. A particle in such a position presents its greatest cross-sectional area perpendicular to the gas flow, that is, the flattest side faces the flow. When silicon deposits on particles in this orientation, the sphericity of the particles is enhanced. There are a number of ways to regulate the system to achieve a particle Reynolds number of 5.5 to 200 at the bottom of the vessel. Such regulation can be accomplished using one or more steps: classifying particles inside the vessel such that the largest beads move to the bottom of the vessel, entraining the particles in the fluidizing jet, maintaining inlet and outlet flow rates and the jet velocity sufficient to promote formation of a particle bed of sufficient height to maintain an elevated reactor back pressure in the inlet zone, regulating the outlet flow control rate to maintain an elevated reactor back pressure in the inlet zone, regulating the velocity of fluids entering the vessel, and providing a vessel having a wall profile adapted to allow operation at a particle Reynolds number of 5.5 to 200 at the bottom of the vessel.

The kinetic power of the gas at the inlet 104 can be varied by changing the mass flow, composition, temperature, or pressure of the gas or the diameter of the tube 130. The inlet kinetic power of the gas is substantially related to the production rate and size of particles generated by impact of the bead particles with each other in the jet 117. As the jet 117 enters the bed 102 inside the inlet zone 116, it entrains bed particles into the jet, causing grinding and attrition between the bed particles resulting in formation of small particles. The small particles, sometimes referred to a ground beads or seed particles, are on the order of 100 to 600 µm. Particles of this size are sufficiently small that they serve as seed beads for additional silicon deposition.

As these hot beads are entrained into the relatively cold incoming silicon-bearing gas, typically in the range of ambient temperature to 450° C., the silicon-bearing gas diffuses to the surface of the hot beads where it decomposes and hot hydrogen and some hot silicon vapor leave the surface and some silicon remains on the surface. This process makes the beads grow colder and larger and depletes the silicon-bearing gas. As the silicon-bearing gas proceeds further up the spout or jet 117 it becomes progressively hotter until by the end of the spout almost all the silicon-bearing gas has been converted into silicon, which has either been deposited on the beads or formed into small amorphous silicon particles. These very small particles then go on up the bed in zones 116, 118, entering the bubbles 119 and void spaces of zone 118. At the top of the jet 117, most of the beads that have been entrained and cooled by the inlet silicon-bearing gas leave the jet 117 and go back down in the emulsion in zone 116 between the sides of the jet 117 and the wall 111. Some of these beads leave through an outlet 107 at the bottom of the reactor 101. The outlet 107 connects to either an annulus 133 that surrounds the jet 117 and connects to a bead withdrawal tube 114 as shown in FIG. 6 or to a decoupled withdrawal tube 114 as shown in FIG. 7. The exiting beads proceed down through the bead withdrawal tube 114, traverse the degasser and bead diverter shown in FIG. 8, and are collected in a convenient container 246 or 253 that will normally be maintained in an enclosed condition such that no contamination of the beads from ambient air is possible.

In the chamber 103, amorphous silicon powder particles form directly from decomposition of silane in the gas phase and have particle diameters on the order of 60 to 1200 nm. It is helpful for the inlet zone 116 and fluidizing jet 117 to be sized and shaped to circulate a fraction of any fine silicon particles formed in the inlet zone 116 into the fluidizing jet 117 so that the fine particles are increased in average size by heterogeneous silicon deposition and so that homogeneous nucleation is suppressed.

In the advantageous embodiment of jet heating, energy can be supplied to the jet area 117 of the chamber 103 in a manner that does not require all of the heat transmission to come through the reactor wall 111. In particular, heat energy can be supplied to the jet by a beam of high intensity light 141 and/or a chemical reaction involving an oxidizing gas 143. This energy supplies most or all of the process heat and replaces some of the heat lost from the bottom of the reactor, thus preventing the net cooling of the beads that would otherwise occur in the jet 117. Such cooling of the beads in the center of the reactor is sometimes described as a depressed temperature profile across the inlet zone 116 of the reactor.

The high intensity light 141, which is supplied by a radiant energy source (not shown), is focused so that it passes up the gas inlet tube 130 without significant loss through the sides 135 and is of a suitable frequency distribution such that energy absorbed by silicon-bearing gas 113 inside the chamber is insufficient to cause decomposition of that gas and such that any residual energy is absorbed by the silicon beads. A variety of focusing techniques for either coherent or noncoherent light can be employed here such as lenses, mirrors, and optical fibers both inside and outside the reactor. Similarly, the desired frequency distribution can be obtained from coherent or noncoherent sources and can be tailored to avoid the known absorption bands of the silicon-bearing gas.

The inner gas delivery or inlet tube 130 is defined by the interior surface of tube wall 131. Tube 132 concentrically surrounds tube 130. An oxidizing reactant gas 143, supplied from a source of a halogen-containing gas (not shown), passes-through an annular space 145 defined between walls of tube 131 and tube 132. The reactant 143 then passes from the annular space 145, through an annular gas inlet 106, and into the inlet zone 116 at a location adjacent to the fluidizing gas inlet 104. Once inside the inlet zone 116, the reactant gas 143 mixes and reacts exothermally with a fraction of the silicon-containing species, such as the silicon beads, silicon dust, and silicon-bearing gas 113 to provide energy which heats the beads in the inlet zone. This exothermic reaction acts as a heat source in the center of the reactor, thus flattening the temperature profile. Because the reaction converts unreacted silicon-containing materials to halogenated species, it also inhibits the deposition of silicon on surfaces around the reactor inlet. The best oxidizing reactants 143 are those that produces a large amount of energy for a small amount of reactant and consumption of a small amount of silicon or silicon-bearing gas. Neither must the oxidizing reactant contaminate the product silicon. Such an oxidizing reactant will best be an elemental halogen or hydrohalide which matches the rest of the system.

Inlet gas stream 115 is a small stream of fluidizing gas, typically on the order of 0.5% to 5% by volume of the total gas flow to the reactor. In the integrated heat exchange embodiment of FIG. 6, the gas stream 115 keeps beads agitated at the exit from the bed and in the outlet passageway or annulus 133, and is motive gas in the withdrawal tube 114. It also strips most of the silicon-bearing gas that has been entrained with the beads as they leave the reactor.

The inlet passageway 130 and the outlet passageway 133 are in thermal communication. Thus, as beads proceed through the outlet 107 and down the annular space or withdrawal passageway 133 which surrounds the inlet gas tube 131 shown in FIG. 3 or FIG. 6, heat transfers from the beads to the gases 113, 115, 143 which are moving toward the inlets 104, 107, 106. This serves to warm the inlet gases. But, the rate of heat transfer at any one location is regulated to be sufficiently small that the temperature of the interior surface of the silicon-bearing gas inlet tube 130 remains below the temperature at which substantial deposition of silicon would occur on the tube wall 131.

However, with reference to the embodiment of FIGS. 2–6, it is advantageous to provide a thin silicon film on the opposed surfaces of the quartz walls 134, 135 to prevent attrition by the silicon beads and the consequent contamination of the silicon. (In the embodiment of FIG. 7 a layer of silicon is provided on the inner surface of the bead withdrawal tube 114.) The silicon film is deposited by thermal decomposition of a silicon-containing compound in the gas 115 which flows through the passageway 133 countercurrent to beads exiting through the passageway 133. Uncontrolled silicon deposition would cause pluggage over time. So, for desirable operation of the reactor, there needs to be a balance between silicon deposition on walls of tubes 134 and 135 and attrition by beads. Thus, the flow and composition of gas 115 is chosen such that a balance is maintained between deposition and erosion of a silicon wall deposit on the wall of the downward tube 114 or on the walls of inner gas delivery tube 134 and outer gas delivery tube 135 which define the annulus 133. The gas 115 may also contain an etchant as needed to increase the rate of silicon removal. By so maintaining an equilibrium between erosion/etching and silicon deposition, the thickness of the silicon layer is maintained in a predetermined range. The flowing of silicon-containing gas and/or etchant in the gas 115 can occur concurrently with the removal of beads through the passageway 133 or during interruptions in the removing, as best suits the operation of the reactor.

Figure 3:
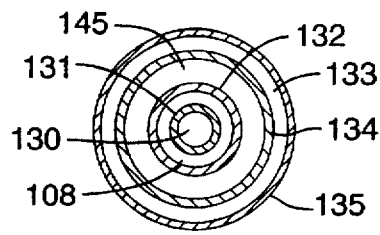
FIG. 3 is a sectional view taken along line A—A of FIG. 6 or FIG. 7.

The heat transfer rate from the outside annulus 133 to the inner passageway 130 can be controlled in various ways. These ways include adjusting the amount of fluidization provided to the exiting beads, selection of the wall thickness of the center tube 131, and providing various heat transfer barriers as shown in FIG. 3. Such a series of barriers can be formed by constructing an inlet tube assembly to have several concentric tubes, such as tubes 132, 134, with gaps therebetween which serve to reduce heat transfer across the gap or gaps between the layers. These heat transfer regulation techniques are useful with the integral heat exchanger system of FIG. 6, but are not necessary in the decoupled system of FIG. 7.

The embodiment shown in FIG. 7 has the heat transfer between the inlet gas 113 and the exiting beads decoupled. It also shows that the gas inlet tube 135 and bead withdrawal tube 114 may be tapered. In this embodiment the inlet gas 113 must be heated entirely to the reactor inlet temperature by utility in the preheater upstream of the reactor. The other inlet gases 115, 143 may also be preheated in either the integral heat exchange embodiment of FIG. 6 or the decoupled heat exchange embodiment of FIG. 7. The beads must then be cooled by utility in the bead withdrawal tube 114 to a safe operating temperature since they no longer heat the inlet gases. The inlet silicon-bearing gas 113 may be heated by any heat source as long as neither the wall temperature nor the bulk temperature exceeds the decomposition temperature of the silicon-bearing gas. Such an arrangement may be desirable if the integral heat exchanger is too difficult to operate or control and utilities are inexpensive.

Stream 115 is retained as a small gas purge in FIG. 7 to purge the gap 133 for the insert, rather than purging the beads as in FIG. 6. This gap 133 serves several purposes: it is a thermal break between the reactor and gas injector, it is an expansion gap if different materials of construction are used for the reactor and injector, and perhaps most importantly, it serves as a clearance gap to allow for manufacturing tolerance if the reactor and injector are mechanically coupled, that is, flanged rather than welded as a single unit. The purge gas 115 may also be a diluent or a halogen-containing gas.

Figure 8:
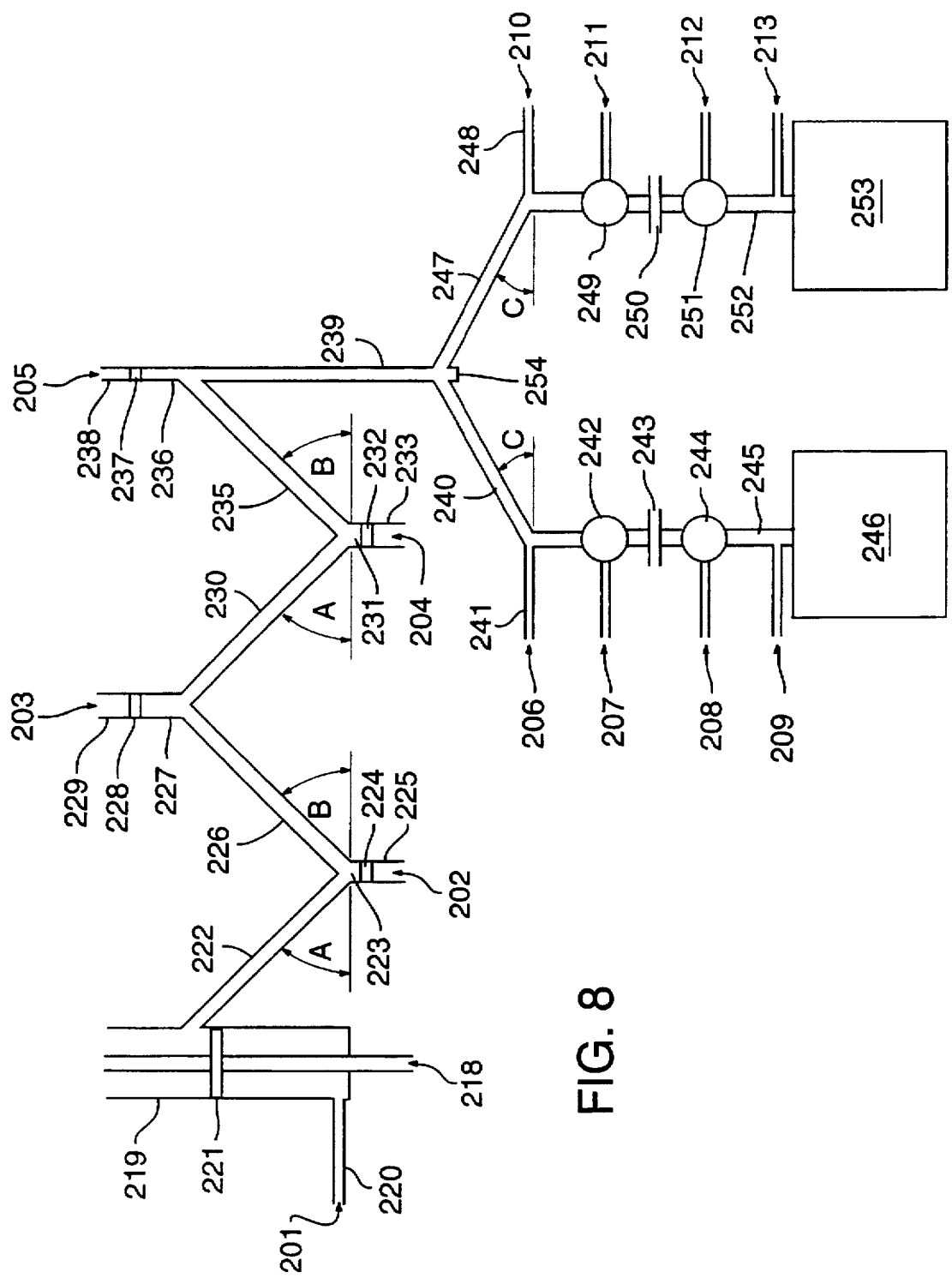
FIG. 8 is a vertical schematic view of a bead removal system having a bead degasser, particle measuring and treatment systems, a bead diverter assembly, purged bead diverter valves, and removable storage containers.

The bead withdrawal tube 114 can be tapered at the top as shown in FIG. 7 to allow for some further segregation of the beads by fluidizing gas that flows countercurrent to the beads. In the integral heat exchange embodiment of FIG. 6, tube 135 would be tapered. This gas is injected in the bead removal process shown in FIG. 8 and can be injected as stream 201 or stream 202. This stream is preferably hydrogen. In this embodiment, the annulus shown in FIG. 8 is replaced by the simple withdrawal tube shown in FIG. 7. The beads are cooled in a heat exchanger 138 that can use gas or liquid for cooling purposes. Coolant will normally enter as stream 136 on FIG. 7, coming in the bottom and leaving out the top as stream 137. The choice of heat transfer medium depends on the overall heating integration.

The gas inlet passageway 130 may also be tapered, if desired. The advantages of tapering are reduced pressure drop and improved transmission of light energy into the reactor. Use of a tapered injector allows the window 142 to be larger than the light beam 141, which reduces scattering from edge effects of the window.

When gas is being injected, the contents of the inlet zone 116 are best characterized as a submerged spouted bed. As the gas leaves the top of the jet 117 it also leaves the inlet zone 116 of the reactor. The gas then enters an upper zone which comprises the tapered zone 118 and the reservoir zone 120 of the illustrated embodiments and which is above the inlet zone 116. The contents of the upper zone 118, 120 are best characterized as a bubbling fluidized bed when the gas is being injected.

FIG. 2 shows a configuration which includes a tapered zone 118 immediately above the inlet zone 116. The illustrated tapered zone 118 has a single taper angle, although more than one angle of taper may be used up to having an angle of taper that varies continuously as a function of elevation. Above the tapered zone is a substantially cylindrical bead reservoir zone 120. It should be understood that the upper zone 118, 120 could consist of a single cylindrical section; such a reactor would be effective in depositing silicon, but would not segregate the particles as well as a reactor wherein at least a portion of the upper zone was a tapered. Use of the tapered section, such as the tapered zone 118, will result in a product having a narrower particle size distribution. It is also possible to use an upper zone 118, 120 that is tapered along its entire elevation; but to avoid reactors having unduly large maximum diameters, it is best that at least a portion of the upper zone be substantially cylindrical, as shown in the reservoir zone 120 of FIG. 2.

The bubbles 119 entering the tapered zone 118 contain a substantial fraction of the seed particles generated in the inlet jet 117 and a large fraction of the amorphous silicon particles. As these bubbles move into the tapered zone 118, the fine amorphous silicon particles tend to be trapped by the larger beads as they proceed from bubble 119 to bubble 119 through the inter-bubble emulsion 121. It is thus beneficial to have substantial space between the bubbles and to maintain the temperature so that the bed of beads in the upper zone 118, 120 acts as a granular filtration device for filtration of the fine amorphous silicon particles.

The larger seed particles can also be trapped by the bed particles, but usually will tend to bounce off the large particles, providing sufficient agitation is available to the particles in that area. Agitation and movement of the bed particles are in any case required to provide protection against substantial agglomeration of the particles in any dead zones that may occur in the bed. The solution to such agglomeration problems is to avoid the presence of such dead zones by careful design of the system.

As the bubbles 119 proceed up the tapered section 118 they provide agitation to the beads. This agitation facilitates the classification of the beads by size such that the larger beads tend to move down to the bottom of the tapered section of the vessel as the smaller beads tend to move upward in the tapered section. The bubble sizes in this region are best maintained smaller than the reactor diameter by control of the reactor tube dimensions. As the tapered section becomes closer to the cylindrical section, the taper may be changed and the bubbles allowed to grow larger, even as large as the diameter of the bed 121 or chamber 103, which are the same diameter. The choice of velocities and bubble sizes is a compromise between effectiveness in terms of filtration of the fine amorphous silicon particles and of providing sufficient agitation to prevent the agglomeration of the bed particles. It is apparent to one knowledgeable in the art that a bed that is less effective as a granular filter may nevertheless serve the purpose if it is taller than a bed that is designed for more effective filtration. It is also possible for one knowledgeable in the art to design such a bed to produce the desired filtration that is economic for the overall reactor system design. In general terms, the higher the bed, the more effective the granular filtration will be, and the more space available for the gas to flow that is not contained in bubbles, the more effective the granular filtration will be.

Once a bubble 119 becomes as wide as the chamber 103, the bed 102 enters into a slugging mode at which point sections of the bed 102 are lifted intact and gas breaks through to continue further on up the bed 102. This leads to bypassing of the filtration mechanism and to a drop in overall filtration efficiency and is normally to be avoided, particularly in the tapered zone 118 where efficient filtration is more important. At the transition between the tapered zone 118 and the bead reservoir zone 120, which also contains a bed that serves as a granular filtration device, it is desirable to change the reactor shape so that it is now substantially cylindrical. This change in shape will also change the mode of fluidization so that instead of segregation of the particles, the bed 102 of particles is well mixed. The benefits of this change are threefold: lower capital cost, particle size control, and maintenance of a silicon wall deposit.

Use of the substantially cylindrical reactor design is more economic to manufacture than the tapered design because of the manufacturability issues involved. Furthermore, as the taper is continued up the reactor, the reactor becomes progressively wider. A wider reactor is a more expensive overall design because not only is the reactor itself more expensive, being a large diameter tapered vessel, but the shroud, heaters, and containment vessels are also larger diameter, adding to the overall cost.

From a process point of view there is also a reason to return to a well mixed condition. In the bead reservoir zone 120 of this reactor the silicon particles grow mainly by filtration of small particles from the gas phase. They also tend to grow rather slowly compared to the rates further down the reactor where the silicon-bearing gas and amorphous silicon powder concentrations are higher. Since it is desired to balance the reactor system so that the number of seed particles generated is substantially equal to the number of particles that leave the reactor as the product, then all the small seed particles must grow to become particles that are suitable for removal as product. If full segregation is maintained, then the particles that reach the very top of the reactor, i.e., the smallest particles, will have difficulty in growing since very little silicon-bearing gas or amorphous silicon powder will penetrate to the top unless inefficiencies in deposition are allowed such that larger amounts of silicon-bearing gas and amorphous silicon powder leave the reactor.

In the well mixed zone 120, all particles can grow because their location within the zone 120 changes. Those particles temporarily lower down the zone 120 will grow at a faster rate than particles further up the zone 120, but since the zone 120 is well circulated, all particle sizes have an opportunity to grow. Thus, it is desirable to mix up the small seed particles that are coming up the reactor with somewhat larger particles that have already grown to obtain efficient deposition of the silicon and filtration of fine amorphous silicon dust while avoiding formation of a layer of small diameter fluff on top of the bed.

While the reactor wall 111 will be made of a high purity material it will still tend to contaminate the product, thus it is desirable to maintain a silicon wall deposit all the way up the reactor. Ideally, this wall deposit would be uniform and in substantial balance between abrasion and deposition, so its growth rate must be slow enough to permit extended operation. The thickness of the wall deposit depends on the contact of the wall with silicon-bearing material and the temperature of the wall. The wall deposit can therefore be minimized in the bottom zones 116, 118 by keeping the bubbles away from the wall 111 and increased at the top 120 by allowing the bubbles 119, which contain amorphous silicon powder, to touch the wall 111, i.e., slugging operation. Similarly, a temperature gradient can be set up so that the wall is hotter at the top than the bottom. Thus, the effect of varying concentration of the silicon species can be offset.

A slip agent can be used to prevent breakage of the reactor due to differences in thermal expansion between the wall and the wall deposits, particularly when cooling down the reactor. A slip agent is a relatively nonsticky layer or coating, deposited on the inside surface of the wall 111 of the reactor prior to introduction of the silicon-bearing gas, to prevent the binding of the ensuing silicon wall deposit to the wall material. The slip agent must adhere but not bind firmly to the reactor wall nor to itself. It may adhere or bind to the wall deposit, since the silicon is very sticky. The slip agent layer must have lower shear strength than the reactor wall so that it will break before the wall 111 when stress is applied as the temperature changes, assuming that the coefficients of thermal expansion are different for the reactor wall and the silicon wall deposit. This can be done by keeping the slip agent in powder form by avoiding sintering through correct choice of material and avoidance of contaminants that are sintering agents, such as boron oxide.

These characteristics may be met by any finely divided powder or dust that has a Tammann temperature greater than the bed operating temperature. Best results are achieved with a powder that has a melting point in Kelvin that is more than twice the temperature, also in Kelvin, of the deposited layer of silicon during operation of the reactor system. Suitable materials include, but are not limited to, silica ($SiO_2$), alumina ($Al_2O_3$), carbon (C), silicon nitride ($Si_3N_4$), silicon carbide (SiC), and mixtures of such materials. Of these, silica is best because of purity and convenience. A finely divided silica layer can be deposited by oxidizing or hydrolyzing a silicon-bearing gas inside the heated reactor prior to start up. In the present invention it is most convenient that the center tube be used to introduce the silicon-bearing gas and the annulus be used for the oxygen-containing gas. The use of a diluent for both gases is advantageous in obtaining an even thin coat, that is, the silicon-bearing gas and the oxygen-containing gas concentrations can vary between 0% and 100%. A minimum coating thickness of 0.1 μm is required, but thicker deposits are acceptable with best results in the range of 1 to 5 μm. It is important that there be multiple layers of particles in this coating layer to be effective as a slip agent, hence the requirement that the particles be an order of magnitude smaller in diameter than the thickness of the slip agent layer.

To further protect the reactor, silicon deposited on the vessel wall should be at least partially removed prior to allowing the wall of the vessel to cool by more than 100° C. This can be accomplished by etching at or near the operating temperature using a halogen-containing gaseous etchant.

For convenience, the calculations with regard to reactor design typically use an average particle size. However, the particle size of the seeds generated will vary significantly and there will be a particle size distribution of those seeds. Thus, the mixing in the well-mixed bead reservoir zone 120 allows all the beads to grow to a suitable size before entry into the tapered section 118. In operation, as the beads grow from seed size (60 to 1200 μm) to the size at which they will be too large to stay within the well-mixed bead reservoir zone 120, they will then drop into the tapered zone 118 where they will progressively grow as they continue to trap amorphous silicon dust particles and residual silicon-bearing gas. As they grow larger, the beads will proceed down the tapered zone 118 in substantially plug flow. They will, of course, be agitated by the passing bubbles 119 and recirculated within a section of the plug flow area 121 to provide agitation or general movement to avoid sticking the beads together, as would be the case in a packed column.

As these beads proceed down the column, they become larger from growth due to deposition from silicon-bearing gas and scavenging of the small amorphous silicon particles. They then enter the bottom zone 116, which is again well mixed, where the particles are circulated multiple times through the jet 117 before continuing out the annulus 133 or withdrawal tube 114. Thus, in the system of the present invention it is possible to avoid the addition of seeds on a continuous or batch basis and to provide continuous removal of the desired product beads from the reactor. The desired product will then have a narrow size distribution because of the built in segregation of the particles by size within the tapered section 118 above the inlet zone 116. The beads can again be segregated by size by tapering the bead withdrawal tube 114 or the annulus 133 immediately as it leaves the inlet zone 116.

It is recognized that control of the particle size distribution is a difficult problem that must be addressed in design and operation of the reactor and that both coarse and fine control may be needed. Coarse control of the new seed particle production can be achieved by selection of the diameter and design of the inlet orifice 104 defined by tube 130 and by variation of the mass flow and density of the inlet gas 113. Fine control of the amount of grinding can be provided by adjusting the flow through one or more supplemental inlets 125 which produce supplemental jets, such as jet 105. The kinetic power can be adjusted by changing the inlet orifice diameter, fluid composition, mass flow, pressure, and/or temperature. The supplemental jets, which increase the frequency of bead impacts and promote additional grinding, are best located above the inlet zone 116. Most advantageously, such jets are located in the well-mixed zone bead reservoir 120. The gas injected through supplemental inlet 125 would normally be a non-silicon bearing gas such as hydrogen, but it is possible that additional silicon-bearing gas could be injected at this location, providing sufficient additional reactor height was provided above the location to fully utilize the silicon-bearing gas.

As gas exits from the top of the bed in zone 120, it will carry with it particles from the bed. These particles will proceed up with the gas into the disengaging zone 122 where those particles with greater than terminal size will return and those particles with terminal size or smaller will tend to continue out of the reactor, via a top port 144 and gas outlet tube 124, depending on their size. One knowledgeable in the art can calculate the proportion of those particles that leave the reactor versus the proportion that will return to the bed in the disengaging zone 122. It is known from literature that this disengaging zone 122 can be calculated based on the diameter of the reactor, diameter distribution of the particles, gas and particle properties, and the velocity of the gas through the reactor. Of particular note in this design is that because of the choices of reactor diameter, gas flow rate, and the avoidance of the addition of very small seeds, there is little carry-over of silicon out of the reactor such that cyclones internal to the reactor, which may be seen in other fluidized beds, are not required. An external cyclone or knockout pot (not shown, but just downstream of the illustrated gas outlet tube 124) may be desirable, however, to contain bed upsets or "burps" that can occur, especially at startup.

There is a small amount of fine amorphous silicon powder that will not be trapped in the bed and will proceed upward through the gas outlet tube 124 and into downstream piping. An additional inlet 123 can be provided in the piping 124 or at the top of the reactor vessel 101 for etchant gas. The etchant gas is used to inhibit the deposition of silicon or silicon halide polymers in the downstream systems of the reactor. The etchant gas digests amorphous silicon particles that come out of the bed and reacts with any unreacted silicon-bearing gas to produce gaseous halogenated species. This inhibits pluggage in downstream piping, without using sophisticated filtration equipment, and thus allows continuous operation of the reactor for an appreciable length of time without the need for shutting down the reactor because of pluggage in downstream equipment. The inlet for the etchant gas 123 is normally located above the disengaging zone 122, as characterized by the transport disengagement height (TDH), such that the gas will not contact particles that could return to the bed, potentially conducting contaminants from the etchant gas to the bed. Gases that can be injected at this location include any of the halogen-containing gases that are known to react with silicon at the temperature, pressure, and other conditions applicable at the top of the reactor. Such conditions will normally include temperature in the range of 400° C. to 1000° C. Gases other than halogen-containing gases could be used, provided that the products of reaction with amorphous silicon are vapor at the conditions at the top of the reactor and for the conditions in the downstream piping until some convenient location where it may be possible to remove a portion of the vapor by a condenser or by other means.

For convenience in most facilities, gas leaving the reactor via top port 124 will be recycled to another portion of the plant where the silicon-bearing gas is generated and purified. Thus, it will be advantageous to use an etching gas 123 at the top of the reactor that is compatible with the rest of the silicon-bearing gas generating process. For example, in a system where chlorosilanes are utilized in the initial phase of the system, such as in preparation of trichlorosilane or the preparation of silane via disproportionation, it will be best to use chlorinated materials. In systems using other halogens, it will similarly be best to use the matching halogen.

In the general description of the bead circulation, it was noted that the beads proceed in substantially plug flow down the tapered segregation zone 118 until they enter the inlet zone 116. It was also noted that the formation of dead zones is to be particularly avoided in the design of fluidized bed reactors for the production of polycrystalline silicon because of the inevitability of such dead zones to promote agglomeration, especially in the presence of silicon-bearing gas. The transition from the tapered zone 118 to the inlet zone 116 is particularly designed to avoid a known dead zone. This dead zone occurs at the transition point between the top of the jet 117 and the bubble 119 that is forming on the top of the jet. The bubble is then released as the jet pulses, also pulsing the dead zone. The shape of the reactor wall 111 next to this known dead zone changes from the inverted solid frustrum of the tapered zone 118 to a substantially elliptical or spherical shape of the inlet zone 116. This shape as shown in FIGS. 2, 6, and 7 is believed to be advantageous, although it is possible to operate with other shapes without critically changing the circulation of the beads or the effectiveness of the inlet zone 116, since its shape is based primarily on the operation of the inlet jet 117.

As the gas goes up the inlet jet 117, the jet walls are supported by the pressure of the gas leaving the jet through the gaps between bead particles along the side of the wall. As this gas escapes through the gaps between the beads, silicon-bearing gas heats up and reacts to deposit silicon on the beads and to form amorphous silicon powder, most of which is carried up the reactor and filtered out further up the reactor. However, as the gas proceeds higher into the jet 117 it encounters other gas being recirculated down with the beads in zone 116. This circulation pattern induces a significant silicon-bearing gas and amorphous silicon powder gradient across the reactor, highest in the center at the jet 117 and lowest at the wall 111. Since it is desired not to deposit a thick silicon film on the wall 111 of the reactor, only a thin deposit sufficient for protection against attrition, it is therefore desirable to move the wall 111 as far away from the inlet jet 117 as is feasible while still providing agitation and circulation of beads in the inlet zone 116. A substantially elliptical shape provides a low surface area to volume ratio and is normally best, but other shapes, as noted above, could also be used.

In the system of FIG. 2, detailed in FIG. 6, there is some preferential removal of beads that are close to the wall 111 via the annular removal passageway 133. This is generally to be desired because such beads have a less active surface and therefore have less hydrogen on the surface at the time of their removal from the reactor. A similar situation exists in the decoupled embodiment detailed in FIG. 7.

The amount of hydrogen or chlorine adsorbed on the surface of the beads decreases as the temperature increases; therefore, it is desirable to prevent a drop in temperature of the beads in contact with silicon-bearing gas. In FIG. 6 and FIG. 7, two devices are shown for preventing this drop in temperature that would otherwise be caused by the incoming silicon-bearing gas 113. A beam of light 141 is projected through an inlet window and/or lens 142, up the inlet tube 130, and into the reactor, passing through the silicon-bearing gas 113, and heating up the beads entrained in and surrounding the inlet jet 117. A halogen-containing gas stream 143, preferably an elemental halogen such as chlorine, is injected into an annular gas space between tubes 132, 134. The halogen-containing gas stream 143 surrounds the silicon-bearing gas stream 113 so that the gases mix and react at the injector tip 104, 106 inside the reactor inlet zone 116. The heat of reaction of the halogen with the silicon beads and/or the silicon-bearing gas heats the beads.

FIG. 8 shows the details of the bead removal process and apparatus whereby beads are transfered continuously from the reactor to one of at least two containers. At the left-hand side, a gas stream 201 (which corresponds to stream 115 of FIG. 6) passes through a tube 220 and enters the bottom of a reactor annulus (133 in FIG. 6) defined between a gas inlet tube 218 (131 in FIG. 6) and a bead withdrawal or outlet tube 219 (135 in FIG. 6) to fluidize and strip residual silicon-bearing gas from beads in the annulus 133. This gas may be hydrogen or any other reactor compatible, non silicon-bearing gas. The gas passes up through a frit 221 and into the annulus. Beads proceed down the annulus to the base of the bead withdrawal tube 219 then continue down a first angled transfer tube 222 by gravity, preferably in an unfluidized condition. At the base of the tube 222, the beads fall into a small cup 223 which holds a small bed of beads. Since the falling beads land on the bed, equipment is protected from abrasion and the beads from contamination.

A first stage degassing gas 202 is delivered via a tube 225 to another frit 224. The gas 202 passes through the frit 224 and pushes the beads up transfer tube 226. The beads again fall by gravity down the second angled transfer tube 230 to the second stage of the degasser. At the base of the tube 230, the beads fall into a small cup 231 which holds a small bed of beads. A second stage degassing stream 204 is delivered via a tube 233 to frit 232. The gas 204 passes through the frit 232 and pushes beads up transfer tube 235 into a degassing column 239. The beads come down the degassing column 239 where they are stripped of any residual gases, then fall into small cup 254 which holds a small bed of beads.

Opening into the bottom of the degassing column 239, just above the cup 254, are two receiving ports that are openings into passageways defined by tubes 240, 247. An inert gas flows into the column 239, via at least one of the ports, to remove gas used to transport beads to the column 239. Depending on the gas flows, the beads will then either go through tube 240 or through tube 247. When the gas flow through tube 241, i.e., stream 206, is large enough compared to the gas flows on the other side 210, the beads will go down tube 247 through valves 249 and 251 into hermetically sealable container 253. Conversely, when the gas flow through tube 248, i.e., stream 210, is large enough compared to the gas flows on the other side 206, the beads will go down tube 240 through valve 242 and valve 244 into hermetically sealable container 246.

In operation, the streams 202 and 204 are normally pulsed to provide a wide range of control over the bead flow rate coming out of the reactor. The length, frequency, and magnitude of the pulse can be controlled to determine the flow rate of the beads.

In an advantageous operation, stream 201 and stream 202 would both be hydrogen such that only hydrogen goes into the reactor. The benefit of this is in recycle of the effluent hydrogen from the top of the reactor. If recycle is not desired, then stream 202 could be an inert gas such as argon that will be used for the ultimate packaging. Stream 204 and the other streams, 206, 207, 208, 209, 210, 211, 212, and 213 will all be an inert gas such as argon or nitrogen that will be used for the ultimate packaging of the beads. The purpose of this gas is to remove residual hydrogen and insure that the atmosphere in the bead packaging 246 or 253 is safe. Degassing vents 229, 238 are provided over gas disengaging zones 227, 236 where gas is separated from passing beads. Frits 228, 237 are provided between the gas disengaging zones 227, 236 and the vents 229, 238 to prevent bead carry-over in the event of upsets. Streams 203 and 205 will both be vented to the downstream scrubber or vent (not shown).

Figure 9:
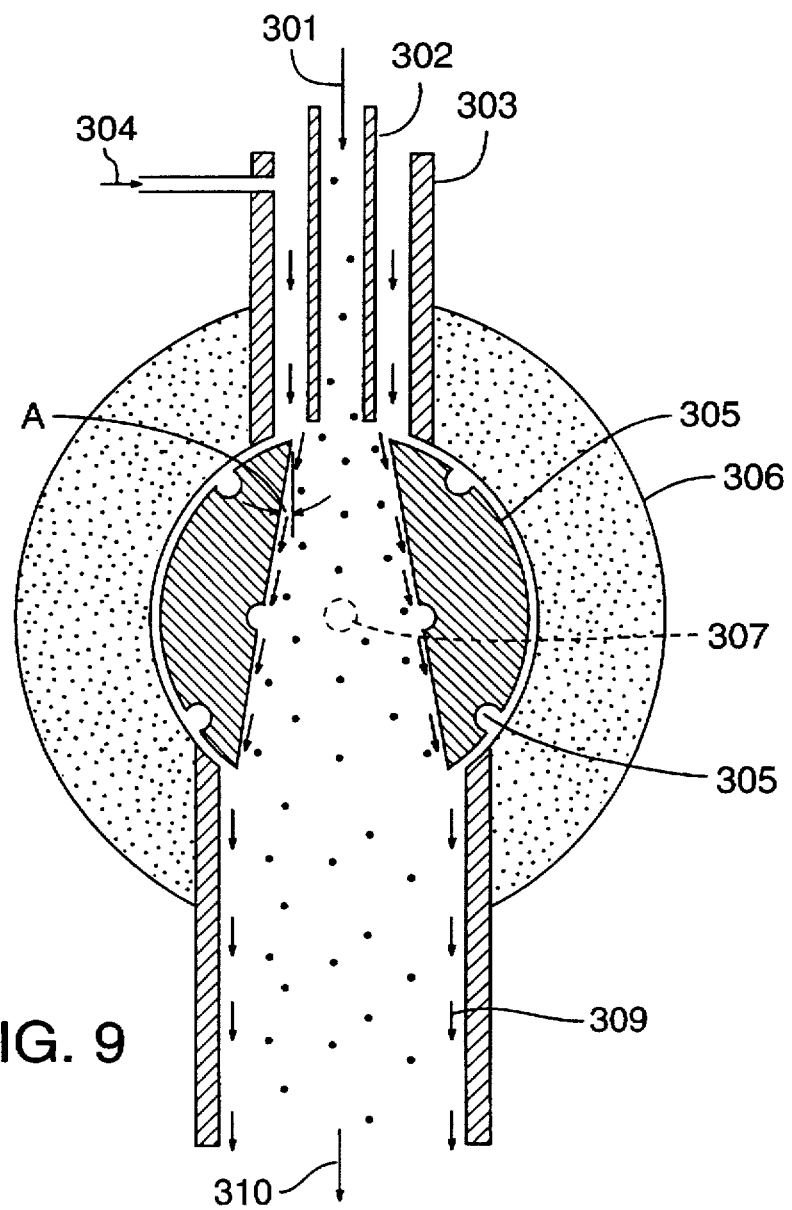
FIG. 9 is a vertical, cross-sectional, schematic view of a purged bead diverter valve.

In a valving system used to isolate the transfer vessels 246, 253, two purged valves are used for each transfer vessel. On the left side, these are valves 242, 244; there is a flange 243 between these two valves to facilitate removal of the transfer vessel. Both valves are purged as shown in FIG. 9, which illustrates a purged gas shutoff valve. Similar valves 249, 251 and a flange 250 are provided on the right side. None of the valves 242, 244, 249, 251 is gas tight; they are designed to deliberately allow the passage of gas through them. During bead collection, the valves are open to bead flow with a small flow of purge gas 207, 208, 211, and 212, respectively to insure that beads and fragments do not block the gap between the valve plug 305 and the valve body 306 inside the valve.

Beads that pass through the valves 242, 244, 249, 251, are delivered to the hermetically sealable vessels 246, 253 via tubes 245, 252. While a vessel is being filled with beads, it is helpful to vent the vessel via a vent valve (not shown). When the filling of a vessel 246 or 253 is nearly complete and it is time to make a transfer, the beads are diverted from the vessel that is being filled to the other vessel by switching the gas flows. For example, if vessel 246 is being filled, gas flow 210 would be higher than gas flow 206, thus the beads would be flowing into vessel 246. Then when it is time to change vessels, flow 206 would be increased and flow 210 would be decreased, thus the bead flow switches to vessel 253. More specifically, the change would be made by venting the empty container 253, increasing gas flow into the column 239 via the receiving port connected to the full container 246, reducing gas flow into the column 239 via the receiving port connected to the empty container 253, and closing the valves 242, 244 to isolate the full container 246. Preparation for the next transfer is then accomplished by purging the full container 246 with inert low oxygen content gas, disconnecting the full container 246 from the port by disconnecting the flange 243, hermetically sealing the full container 246, connecting another empty container to the port from which the full container 246 was removed by attaching the new container at the flange 243, and opening the valve 242 and the valve 244 on the newly connected container. It is also feasible to pull gas down through the vessels using the two way streams 209 and 213, effectively using stream 213 as a vent instead of a purge. This can be done by suitable valving.

When it is required to transfer the vessels, first the bead flow is diverted as discussed above, and any residual beads are allowed to fall down into the vessel 246 or 253. To remove transfer vessel 246, the purges to the respective valves 242 and 244 may be increased to blow out any residual beads and the valves are closed to provide a flow restriction to the gas flows. Again, the valves are not designed to be gas tight, but to restrict the flow of gas so that the disconnection can be made without disrupting the flows inside the system, yet constantly purging out to avoid contamination from the surrounding air. The flange 243 is then disconnected, at which time the purge gas will flow in stream 207 down through valve 242 and out through the disconnected flange 243, at the same time maintaining the system pressure. Similarly, gas will flow in stream 208 through valve 244 and up through the disconnected flange 243. This will insure positive purging of this area during disconnection.

The transfer vessel is moved from its location and a cap or blank flange of some kind can be placed to close off the vessel side of flange 243 for shipment. This will then provide the required gas tight connection on the container. Similarly, purge gas connections that provide streams 208 and 209 can also be valved and capped. The standing flange 243 can either be capped or another vessel attached and purged, ready to receive product beads.

The setup for other transfer vessels is essentially the same. Although the minimum of two legs and two vessels is shown in FIG. 8, the system is not restricted to just two legs: it may have as many legs as is desired. It may be best to also have a third sample leg or to set up a multiple system of four, five, six, or any reasonable number legs. This can be simply done by arranging legs, of which 240 and 247 are typical, in a radial structure.

The angles shown, A and B, are variable. Angle A should insure gravitational flow of the beads in legs 222 and 230 and angle B should allow the beads to be blown up legs 226 and 235 using the gas pulses 202 and 204, respectively. Angle A will best be from about 30° to 60° as will angle B, but both angles do not necessarily have to be equal in an optimal system. Similarly, in the bead diverter system the angle C shown may be between −45° and 90° but is normally between −30° and 30°. This is primarily for convenience in transportation and avoiding erosion in the tube and to prevent flow of beads to the wrong vessels.

FIG. 9 shows the details of a purged shutoff valve suitable for the valves 242, 244, 249, 251 shown in FIG. 8. Beads go down through tube 301, designed to be smaller than the opening to the valve. There is a clearance in the bottom of tube 302 between it and a valve plug 305. The beads then fall through the valve plug 305 and into an outlet tube 309, which is preferably wider than the inlet tube, and flow out stream 310 through the system and into a receiving vessel.

There are several purges provided in this valve. First, there is an upper purge 304 in the annular space between tubes 302 and 303. This gas flows down around the bead stream 301 and blows across the gap between the bottom of tube 302 and the valve plug 305. The purpose of this stream is to encourage any beads or bead fragments to go down through the valve as opposed to being trapped between the valve plug 305 and the valve body 306. Similarly, holes can be provided in the outer portion of the valve plug 305 such that gas coming in through center hole 307 may be distributed through the valve plug 305 and exit holes such as hole 308 so as to purge the gap between the valve plug 305 and the valve body 306. This gap is essential for purging of the valve to prevent scraping of the valve body by beads or bead fragments Holes can also be provided in the inner portion of the valve to encourage the beads to stay away from the wall of the valve plug 305 and the valve exit tube 309, designed to decrease contamination from contacting of the beads with the valve. Angle A also is designed to keep the beads away from the valve plug 305 without opening the gap between the valve plug 305 and the valve body 306. It should be noted that much of this structure can be manufactured from high purity silicon-containing materials such as silicon or vitreous silica (quartz), and different materials may be used in different locations depending on abrasion and purity issues. For example, in very high abrasion areas it would be desired to use a very high purity material such as high purity quartz, synthetic quartz, or polycrystalline silicon so that the contaminants introduced will be compatible with the product. The clearances available in the system allow the use of dissimilar materials with different coefficients of thermal expansion without seizing of the materials when handling warm beads.

FIG. 10 shows a method of using machine vision to provide on-line particle analysis, which is crucial for efficient operation of the fluid bed reactor. On-line particle analysis provides immediate feedback on measurements such as length, width, area, average diameter, and particle size distribution of the silicon beads coming out of the reactor. Such information is crucial for control of the reactor and its availability in real time is a very valuable control tool. In this system it is shown there is a way of obtaining such information without contaminating the beads. Beads which leave a reactor via the bead removal tube 114 are passed to apparatus which causes the beads to move along a noncontaminating, planar surface. First the beads are allowed to fall through a noncontaminating tube 401 into a small pocket 402 where the beads will then only impact upon themselves. Then, beads which overflow the pocket 402 move down a sloping section 407 of the noncontaminating, planar surface. The surface is sufficiently wide that the beads spread out in a monolayer 403, flow across the sloping section 407, and exit as stream 404 into the collection system. Angle A is between 0° and 60° to maintain smooth flow of beads in a monolayer 403 over the sloped surface 407. A machine vision system 406 is aimed through a window 405 to detect bead properties. The machine vision system 406 acts as a sensing mechanism that counts and measures the dimensions of the beads, calculates the particle size distribution, and signals the data as required. Such machine vision systems are available in the industry, but difficulty has risen in the noncontaminating use of them. Machine vision systems also exist where the beads can be measured in the dense phase, that is, filling a clear vertical tube.

A system having a similar configuration, shown in FIG. 11, can be utilized for improving the surface characteristics of the beads. In this system, the beads are heated by exposure to high intensity light. The beads fall through noncontaminating tube 501 into a pocket 502 and are spread out into a monolayer 503 on a sloping noncontaminating surface 507 and exit as stream 504 into the collection system. Angle A is between 0° and 60° to maintain smooth flow of beads in a monolayer 503 over the sloped surface 507. The window 505, provided above the monolayer 503, can be made of quartz or any other high purity material that is transparent to the frequency of light to be used. Light 508 is directed through the window 505 from a suitable coherent or noncoherent high intensity light source 506 to improve the surface characteristics of the beads. It is also possible to introduce with the beads in tube 501 a gas selected to improve surface mobility or in other ways enhance the surface of the silicon particles. Such gases may be halogenated materials of various kinds. The choice of a laser or other high intensity light source 506 will be dependent on the result wanted. For example, if it is desired to rapidly heat only the surface of the beads, a relatively short wave length light will be used so that the penetration of light into the beads is limited and the amount of heat that is supplied can be reduced to that sufficient only to heat up the surface of the beads. In a particularly advantageous embodiment, the light is of the appropriate frequency and sufficient intensity to scan and flash heat the surface of the beads to a temperature of 800° C. to 1500° C. in a gas atmosphere selected to promote surface mobility and a smooth bead morphology.

FIG. 12 illustrates the removal of oxygenated compounds, such as oxygen, water, carbon monoxide, and carbon dioxide, from a stream 601 of a halogen-containing or diluent gas which is to be injected into a reactor. The diluent gas may be hydrogen, nitrogen, argon, or the like. Stream 602 is a silicon-bearing gas such as silane, trichlorosilane, etc. A mixer 604 contains a mixing element 603 such that the halogen-containing or diluent gas and the silicon-bearing gas are intimately mixed. It is also possible to apply some degree of heat in this area, if needed. The silicon-bearing gas will react with the oxygen containing compounds contaminating the other gas to form solid particles. The mixture 605 of gases and particles then goes through a fine mesh filter 607 and the purified halogen-containing or diluent gas and residual silicon-bearing gas 608 proceed into a reactor system, for example via the tube 115. Stream 606 shows removal of solid particles, in particular silicon oxide materials, typically done in batch mode for a filter.

Figure 13:
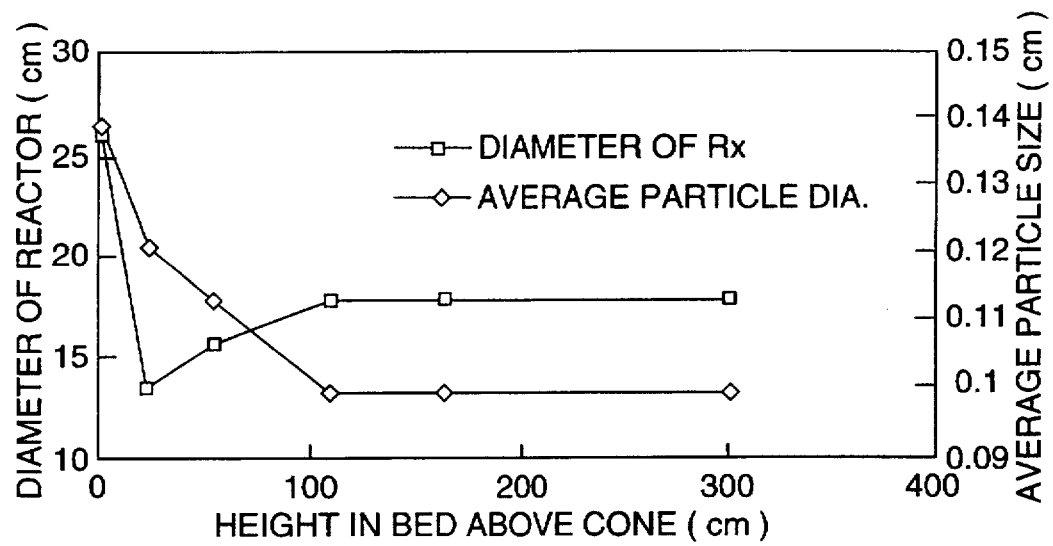
FIG. 13 is a plot of the particle size and the cross-sectional diameter of a reactor vs. the height of the reactor.

FIG. 13 shows the variation of the reactor diameter and particle size with height for 1.5 mm particles exiting the reactor. At the very bottom of the reactor there is a wide section of the reactor that is approximately 26 cm in diameter at which point the average particle size is just under 0.14 cm or 1.4 mm. Material leaving the reactor is slightly larger than the average particle size in the bottom of the reactor. The reactor then narrows down to approximately 13 cm at which point the average particle size is about 1.21 mm. Reactor diameter is then increased in two steps, first to about 16 cm and finally up to 18 cm. In this tapered section segregation of the particle by size takes place. The drop in particle size with increased height from the inlet is shown going from 1.21 mm to approximately 0.9 mm. At the top of the reactor after the tapered section the reactor remains straight and the average particle size is unchanged. This demonstrates the three zones of the reactor: in the bottom of the reactor the particle diameter increases dramatically because of deposition where the reactor is well mixed, in the tapered section the particle size decreases going up the reactor, and at the top of the reactor the bed is well mixed and the particle diameter remains the same.

Figure 14:
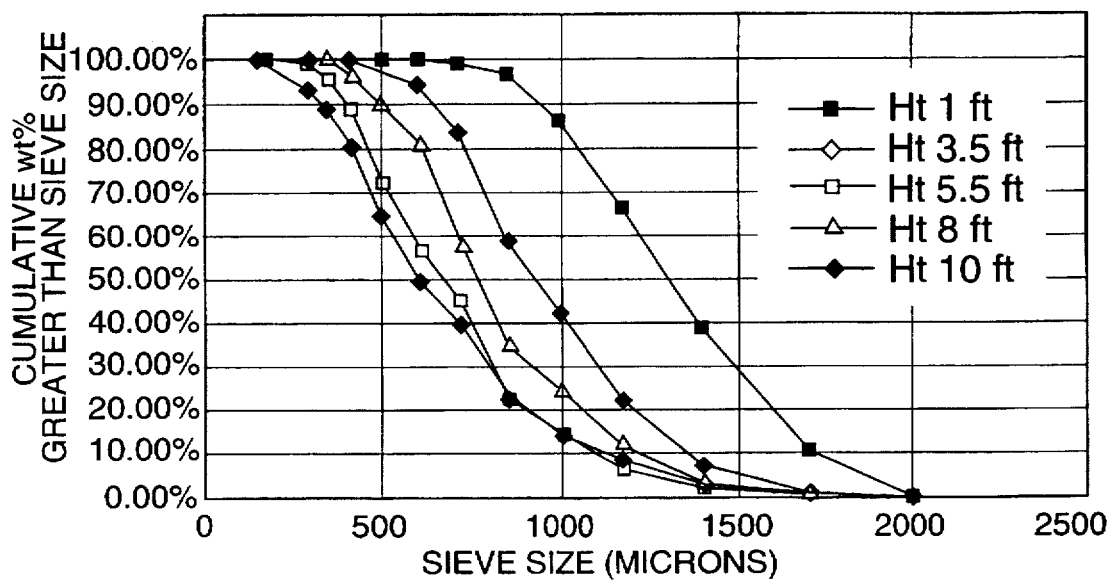
FIG. 14 is a plot of the particle size distribution in a reactor at different heights above the inlet.

FIG. 14 illustrates the results of particle size distribution measurement from a reactor showing the distribution in particle sizes at different heights. The key ratios are 10%, 50%, and 90% as they show the particle size distribution and the average particle diameter. Thus, at 1 ft. from the bottom, the average particle size is 1400 microns with a range of 935–1700 microns (10%–90%). At the 10 ft. height, the average size is 600 microns and the range is 330–1120 microns (10%–90%). This demonstrates the features of the reactor where larger particles exit from the bottom of the reactor and those particle sizes have a narrow size distribution. The tapered section produces a narrow particle size distribution and an increase in particle size toward the bottom of the taper. At the top of the reactor there is a wide range of particle sizes in a well-mixed bed such that all particle sizes can grow simultaneously. When they reach a size that is appropriate for them to leave the straight section they proceed down the tapered section and finally out of the reactor.

EXAMPLE

The following example describes the use of the reactor of FIGS. 2–7 to harvest elemental silicon. A reactor 101 was constructed of quartz tubing. The reactor included inlet, tapered, reservoir, and disengaging zones having dimensions as follows: the inlet zone 116 was approximately elliptical with a diameter of 25 cm and length of 40 cm. A first section of the tapered zone 118 started at 17 cm diameter and ended at 23 cm diameter and was 50 cm long. A second section of the tapered zone started at 23 cm diameter and ended at 25 cm diameter and was 80 cm long. A reservoir zone, having a diameter of 25 cm, extended 350 cm from the top of the tapered zone to the top of the bed. And, a 25 cm diameter disengaging zone extended an additional 260 cm from the top of the reservoir zone to the top of the reactor. A 30 cm long outlet tube 124 was provided at the top of the reactor with a 25 mm inside diameter (ID). A gas inlet tube 135 at the bottom of the reactor was 30 cm long. Inside the tube 135 an insert 131 was located and was flanged to the bottom of the main reactor. The insert 131 was manufactured from quartz and had dimensions as follows: 50 mm ID at the bottom, 12 mm ID at the top, and wall thickness of 2.5 mm. At the bottom of the insert 131 was a connection with a 7 mm ID delivery tube for inlet gas 113. An exit 107 for the particles had a 12 mm ID. The combined height of the overall reactor was 840 cm.

To begin operation, silicon was introduced through the top port 144 from a silicon bead vessel (not shown) that had been connected to the top port 144 as a temporary measure. Using this temporary bead addition vessel, the reactor could be fed with beads. Several charges of beads were needed. The initial charge was for the lower inlet zone 116 where an average particle size of approximately 1.4 mm was desired. The second charge was for the initial tapered zone where an average of particle diameter of 1.25 mm was charged and then for the second tapered zone an average particle diameter of 1.14 mm was charged. The top section had an average particle diameter of 0.97 mm. The resistivity of the silicon seed particles was determined to be greater than 200 ohm-cm and the fluidizing and source gas consisted of 100% silane except for start up where inert gases and hydrogen were used as initial start up gases.

The reactor was purged with inert gases, and an initial charge of silicon particles was introduced, as noted previously, to fill the inlet zone 116. Then subsequent charges were added until the reactor was full of beads. Concurrent with the addition of beads was the establishment of heat up using the wall heaters and the preheater to start warming up the inlet gas 113 to provide better fluidization quality as the additional beads were added.

The hydrogen flow was initiated at 200 standard liters per minute (SLM) utilizing both the passageway 130 through the injector 131 and the bead withdrawal annulus 133 surrounding it. Power to the reactor was started at 10 kW and then increased to 30 kW as the bed height was raised to 580 cm above the inlet by the addition of bed particles. This flow rate of hydrogen was reduced as the desired operating temperature of 850° C. was obtained and the power was reduced and set to control the temperature profile of the wall by the individual zones. Then the high intensity light source was turned on and light was sent up the gas injector into the jet area and the wall temperature set point was reduced for the inlet zone 116. Next, 2 SLM of chlorine was initiated through tube 143 and cooling water circulation was established through tubes 136 and 137 to and from the bead cooler 138. Silane, the silicon-bearing gas, was then introduced into the bottom of the reactor and the bead withdrawal was initiated by reducing the hydrogen flow in the annulus 133. Both silane and hydrogen entered the base of the inlet zone 116 at approximately 350° C. after being heated by a separate silane preheater (not shown).

The flow rates were adjusted to maintain fluidization by reducing the amount of hydrogen progressively as the silane content increased. After approximately one hour, the reactor was operating on 100% silane, the feed rate was approximately 210 SLM silane. There was a small hydrogen purge stream 115 of 2 SLM in annulus 133 to provide bead removal fluidizing gas. At the top of the reactor a carry-over of fine amorphous particles was substantially eliminated by the injection of 8 SLM of chlorine gas at ambient temperature through inlet 123. The product was removed from the reactor at approximately 30 kg/hr and had an average diameter of 1.5 mm (1500 microns). In a typical run, 320 kg of silicon starter bed would be charged. The product rate would be 30 kg/hr and a typical run duration would be one to two weeks. The process of charging the bed introduced some contamination, but after substantial bed turnover, the harvested material was of quality useful for the production of semiconductor devices.

The average power consumption was 11 kW in the reactor with some additional process heat provided by a silane preheater before the reactor at approximately 2 kW/hr for an energy consumption of 0.5 kW/kg. Such energy consumption is significantly lower than the 40 kWh/kg quoted for other microwave heated quartz fluid beds where active cooling of the distributor grid and walls is practiced. The energy efficiency of the power supplies varied from 2% for the directed light to 50% for the wall heaters and the silane preheater. Directed light provided 3 kW of process heat and the chlorine reaction provided 2 kW of process heat. The microwave heater provided 1 kW of process heat and 1 kW of heat losses in the inlet zone 116. Wall heaters provided 4 kW of heat loss compensation in the upper zones. The electrical input was thus 150 kW to the directed light, 4 kW to the microwaves, 8 kW for the wall heaters and 4 kW for the silane preheater for a total of 166 kW or 5.5 kW/kg.

In view of the above, it is to be understood that the present invention includes all such modifications as may come within the scope and spirit of the following claims and equivalents thereof.

We claim:

1. A process for the deposition of silicon on particles that are located inside a vessel, the process comprising:

providing a reactor having a vessel, which vessel has a wall which defines a chamber having at least two zones including (a) an inlet zone and (b) an upper zone that communicates with and is located above the inlet zone to receive gas moving upwardly from the inlet zone, and which vessel has a fluidizing inlet for delivering gas into the inlet zone;

injecting a silicon-bearing gas through the fluidizing inlet to provide a fluidizing jet in the chamber without passing the gas through a distribution plate so as to maintain particles in the inlet zone in a submerged spouted bed;

maintaining particles in the inlet zone at an operating temperature sufficient to cause silicon to deposit from the silicon-bearing gas onto particles in the inlet zone; and maintaining particles in the upper zone in a bubbling fluidized bed.

2. The process of claim 1 wherein the injecting comprises delivering the silicon-bearing gas into the inlet as a fluidizing jet of sufficient velocity to circulate the particles inside the vessel and cause particles to impact each other in the inlet zone such that grinding of particles occurs to form ground particles of sufficiently small size that the ground particles serve as seed particles to receive silicon deposited from the silicon-bearing gas.

3. The process of claim 2 further comprising controlling the amount of grinding by changing at least one parameter selected from the group consisting of orifice diameter of the fluidizing inlet, composition of the silicon-bearing gas, mass flow of the silicon-bearing gas, pressure of the silicon-bearing gas, and temperature of the silicon-bearing gas, to adjust the velocity of the jet.

4. The process of claim 2 wherein:

the vessel has a supplemental inlet for delivering a supplemental gas into the chamber at a location above the fluidizing inlet; and the process further comprises (a) injecting a supplemental gas through the supplemental inlet to produce a supplemental jet of gas in the vessel at a location above the fluidizing inlet, the supplemental jet being sized and positioned to increase the frequency of particle impacts and provide additional grinding of particles propelled by the supplemental jet and (b) controlling the amount of grinding by changing at least one parameter selected from the group consisting of orifice diameter of the supplemental inlet, composition of the supplemental gas, mass flow of the supplemental gas, pressure, and temperature to adjust the velocity of the supplemental jet.

5. The process of claim 2 further comprising circulating a fraction of any fine silicon particles that are produced inside the vessel into the fluidizing jet so that the fine particles are increased in average size by heterogeneous silicon deposition and so that homogeneous nucleation of amorphous silicon particles from the silicon-bearing gas is suppressed.

6. The process of claim 1 further comprising maintaining a bed of the particles in the upper zone, the bed being of sufficient height and being maintained at a sufficient temperature that the bed acts as a granular filtration device to trap silicon powder that enters the bed.

7. The process of claim 1 further comprising injecting into the chamber, a halogen-containing gas which is suitable to convert any silicon dust and any unreacted silicon-bearing gas to halogenated species at temperatures and pressures sufficient to inhibit the deposition of silicon or silicon halide polymers on piping and equipment which receive effluent gas from the chamber.

8. The process of claim 1 further comprising, prior to allowing the wall of the vessel to cool by more than 100° C., at least partially removing deposited silicon from the wall by etching at or near the operating temperature using a halogen-containing gaseous etchant.

9. The process of claim 1 wherein the silicon-bearing gas comprises a gas selected from the group consisting of silane compounds, halogenated silane compounds, and mixtures thereof.

10. The process of claim 9 wherein the silicon-bearing gas comprises:

a gas selected from the group consisting of silane, disilane, dichlorosilane, trichlorosilane, silicon tetrachloride, tribromosilane and mixtures thereof; and a diluent gas selected from the group of non silicon-bearing gases consisting of hydrogen, argon, helium, and mixtures thereof.

11. The process of claim 1 further comprising providing a slip coating on the interior surface of the vessel wall to inhibit adherence of silicon deposits on the surface.

12. The process of claim 11 further comprising:

heating the contents of the vessel; and providing a slip coating that is a powder having a melting point in Kelvin that is more than twice the temperature, also in Kelvin, of the vessel wall surface during the heating.

13. The process of claim 12 wherein the slip coating powder is a material selected from the group consisting of silica, silicon nitride, silicon carbide, alumina, carbon, and mixtures thereof.

14. The process of claim 1 further comprising holding particles in the upper zone at a temperature of 700° C. to 1200° C. for 1 to 24 hours to reduce the hydrogen content of the particles and promote polycrystalline structure in the particles.

15. The process of claim 1 further comprising holding particles in the inlet zone at a temperature of 700° C. to 1200° C., during deposition of silicon on the particles, for a sufficient time to reduce the hydrogen content of the particles and promote polycrystalline structure in the particles.

16. The process of claim 1 for use with a reactor having a gas delivery tube which defines a gas inlet passageway that is in communication with the fluidizing inlet, the process further comprising:

heating material inside the inlet zone by directing radiant energy from a source of radiant energy, via the gas delivery tube, and to the location of the jet; and maintaining the wavelength distribution of the radiant energy such that energy absorbed by silicon-bearing gas inside the chamber is insufficient to cause decomposition of that gas and such that any residual energy is absorbed by the particles.

17. A process for the deposition of silicon on particles that are located inside a vessel, the process comprising:

providing a reactor having a vessel, which vessel has a wall which defines a chamber having at least two zones including (a) an inlet zone and (b) an upper zone which communicates with and is located above the inlet zone to receive gas moving upwardly from the inlet zone, and which vessel has a fluidizing inlet for delivering gas into the inlet zone;

injecting a silicon-bearing gas through the fluidizing inlet to provide a fluidizing jet of sufficient velocity to (a) maintain particles in the inlet zone in a submerged spouted bed, (b) cause particles to impact each other in the inlet zone such that grinding of particles occurs to form ground particles of sufficiently small size that the ground particles serve as seed particles to receive silicon deposited from the silicon-bearing gas, and (c) maintain particles in the inlet zone oriented in the position of maximum drag relative to the gas flow;

maintaining particles in the inlet zone at an operating temperature sufficient to cause silicon to deposit from the silicon-bearing gas onto particles in the inlet zone; and maintaining particles in the upper zone in a bubbling fluidized bed.

18. A process for the deposition of silicon on particles that are located inside a vessel, the process comprising:

providing a reactor having a vessel, which vessel has a wall which defines a chamber having at least two zones including (a) an inlet zone and (b) an upper zone which communicates with and is located above the inlet zone to receive gas moving upwardly from the inlet zone, and which vessel has a fluidizing inlet for delivering gas into the inlet zone;

injecting a silicon-bearing gas through the fluidizing inlet to provide a fluidizing jet at a size, shape, and velocity sufficient to (a) maintain particles in the inlet zone in a submerged spouted bed, (b) cause particles to impact each other in the inlet zone such that grinding of particles occurs to form ground particles of sufficiently small size that the ground particles serve as seed particles to receive silicon deposited from the silicon-bearing gas, and (c) maintain particles in the inlet zone in a position indicated by the particle Reynolds number range of 5.5 to 200;

maintaining particles in the inlet zone at an operating temperature sufficient to cause silicon to deposit from the silicon-bearing gas onto particles in the inlet zone; and maintaining particles in the upper zone in a bubbling fluidized bed.

19. The process of claim 18 further comprising, to achieve a particle Reynolds number of 5.5 to 200, at least one step selected from the group consisting of (a) classifying particles inside the vessel such that the largest particles move to the bottom of the vessel, (b) entraining the particles in the fluidizing jet, (c) regulating the outlet flow rate, (d) regulating the velocity of fluids entering the vessel, and (e) providing a vessel having a wall profile adapted to allow operation at a particle Reynolds number of 5.5 to 200 at the bottom of the vessel.

20. A process for the deposition of silicon on particles that are located inside a vessel, the process comprising:

providing a reactor having a vessel, which vessel has a wall which defines a chamber having at least two zones including (a) an inlet zone and (b) an upper zone which communicates with and is located above the inlet zone to receive gas moving upwardly from the inlet zone, and which vessel has a fluidizing inlet for delivering gas into the inlet zone;

injecting a silicon-bearing gas through the fluidizing inlet to provide a fluidizing jet;

maintaining particles in the inlet zone at an operating temperature sufficient to cause silicon to deposit from the silicon-bearing gas onto particles in the inlet zone;

maintaining particles in the upper zone in a bubbling fluidized bed; and injecting a halogen-containing gas into a region of the inlet zone that contains the jet to keep the vessel wall etched in the region of the jet, to increase the particle Reynolds number, and to heat the region of the jet by energy released from an exothermic reaction of the halogen-containing gas with a fraction of silicon-containing species at the region of the jet, the amount of energy produced by the reaction being sufficient to heat the particles in the jet.

21. A process for the deposition of silicon on a substrate located inside a vessel that has an inlet for the injection of a silicon-bearing gas, the process comprising:

providing a reactor system including a vessel having a wall with an interior surface which defines a chamber and an inlet for the injection of a silicon-bearing gas;

providing a slip coating on at least a portion of the interior surface of the wall to inhibit adherence of silicon deposits to the wall;

providing a layer of silicon on the slip coating, the slip coating being a powder having a melting point in Kelvin that is more than twice the temperature, also in Kelvin, of the layer of silicon during operation of the reactor system;

injecting a silicon-bearing gas through the inlet into the chamber to provide a fluidizing jet in the chamber without passing the gas through a distribution plate; and heating at least some of the contents of the chamber to promote the deposition of silicon on a substrate.

22. A process for the deposition of silicon on particles that are located inside a vessel that has an inlet for the injection of a silicon-bearing gas to fluidize the particles, the process comprising:

prior to the injection of the silicon-bearing gas, removing any oxygen-containing contaminants from the vessel by reacting a halogen-containing gas with the contaminants under conditions that favor formation of solid particles and that disfavor deposition of contaminant films on the particles or the vessel; and injecting the silicon-bearing gas through the inlet so as to maintain particles in a fluidized bed and to deposit silicon on the particles.

23. A process for the deposition of silicon on particles that are located inside a vessel that has an inlet for the injection of a silicon-bearing gas to fluidize the particles and that has an outlet in communication with a particle withdrawal passageway defined by the interior surface of a particle withdrawal tube, the process comprising:

injecting a silicon-bearing gas through the inlet to provide a fluidizing jet in the vessel without passing the gas through a distribution plate so as to maintain particles in a fluidized bed and to deposit silicon on the particles;

removing particles, on which silicon has been deposited, from the vessel through the passageway;

providing a layer of silicon on the inner surface of the particle withdrawal tube; and maintaining the thickness of the layer in a predetermined range by flowing a silicon-bearing gas or etchant through the passageway as needed to maintain equilibrium between etching and silicon deposition.

24. The process of claim 23 wherein the flowing occurs during interruptions in the removing.

25. The process of claim 23 wherein the removing occurs continuously.

26. A process for the deposition of silicon on particles that are located inside a vessel that has an inlet for the injection of a silicon-bearing gas to fluidize the particles and that has an outlet in communication with a particle withdrawal passageway defined by the interior surface of a particle withdrawal tube, the process comprising:

injecting a silicon-bearing gas through the inlet so as to maintain particles in a fluidized bed and to deposit silicon on the particles;

removing particles, on which silicon has been deposited, from the vessel through the passageway;

providing a layer of silicon on the inner surface of the particle withdrawal tube; and maintaining the thickness of the layer in a predetermined range by flowing a silicon-bearing gas or etchant through the passageway, concurrently with the removing and countercurrent to the particles, as needed to maintain equilibrium between etching and silicon deposition.

27. A process for the deposition of silicon on particles that are located inside a vessel, the process comprising:

providing a reactor system having a vessel, which vessel has a wall which defines a chamber having at least two zones including (a) an inlet zone, and (b) an upper zone that communicates with and is located above the inlet zone to receive gas moving upwardly from the inlet zone, and which vessel has a fluidizing inlet for delivering gas into the inlet zone and an outlet in communication with a particle withdrawal passageway defined by the interior surface of a particle withdrawal tube;

providing a plurality of silicon particles inside the chamber;

providing a silicon-bearing gas and a diluent gas;

injecting the silicon-bearing gas through the fluidizing inlet to provide a fluidizing jet of sufficient velocity to maintain particles in the inlet zone in a submerged spouted bed and to circulate the particles inside the vessel and cause particles to impact each other in the inlet zone such that grinding of particles occurs in the inlet zone to form ground particles of sufficiently small size that the ground particles serve as seed particles to receive silicon deposited from the silicon-bearing gas;

injecting the diluent gas into the vessel;

prior to injecting the diluent gas, removing any oxygen containing contaminants from the diluent gas by (a) reacting a silicon-bearing gas with the contaminants under conditions that favor formation of solid particles, and (b) filtering the resulting solid particles from the diluent gas at a location outside the chamber;

controlling the amount of grinding by adjusting at least one parameter selected from the group consisting of orifice diameter of the fluidizing inlet, composition of the silicon-bearing gas, mass flow of the silicon-bearing gas, pressure, and temperature to alter the kinetic power of the jet;

maintaining the particles inside the chamber at an operating temperature of at least 500° C. sufficient to cause silicon to deposit from the silicon-bearing gas onto the particles and on the wall of the vessel;

producing a supplemental jet of gas in the vessel at a location above the fluidizing inlet, the supplemental jet being sized and positioned to increase the frequency of particle impacts and provide additional grinding of particles propelled by the supplemental jet;

circulating a fraction of any fine silicon particles that are produced inside the vessel into the fluidizing jet so that the fine particles are increased in average size by heterogeneous silicon deposition and so that homogeneous nucleation of amorphous silicon particles from the silicon-bearing gas is suppressed;

conducting the injecting of the silicon-bearing gas under conditions such that, in at least a portion of the chamber, particles are inherently oriented in the position of maximum drag relative to the gas flow, which position is indicated by the particle Reynolds number range of 5.5 to 200;

maintaining particles in the upper zone in a bubbling fluidized bed and at a temperature such that the bed acts as a granular filtration device to trap silicon powder that enters the bed;

injecting a halogen-containing gas into the vessel to convert any silicon powder and any unreacted silicon-bearing gas to halogenated species at temperatures and pressures sufficient to inhibit the deposition of silicon or silicon halide polymers on piping and equipment which receive effluent gas from the chamber;

prior to injecting the halogen-containing gas, removing any oxygen-containing contaminants from the halogen-containing gas by (a) reacting a silicon-bearing gas with the contaminants under conditions that favor formation of solid particles, and (b) filtering the resulting solid particles from the halogen-containing gas at a location outside the chamber;

holding particles in the inlet zone at a temperature of 700° C. to 1200° C., during deposition of silicon on the particles, to reduce the hydrogen content of the particles and promote polycrystalline structure in the particles;

holding particles in the upper zone at a temperature of 700° C. to 1200° C. for 1 to 24 hours to reduce the hydrogen content of the particles and promote polycrystalline structure in the particles; and removing particles, on which silicon has been deposited, from the vessel through the particle withdrawal passageway.

28. A process for the deposition of silicon on particles that are located inside a vessel, the process comprising:

providing a vessel having a wall which defines a chamber and a fluidizing inlet for delivering gas into the chamber; and injecting a silicon-bearing gas through the fluidizing inlet in such a manner as to both (a) deposit silicon on particles in the chamber and (b) provide a fluidizing jet in the chamber without passing the gas through a distribution plate, which jet contacts the particles so as to circulate the particles in the chamber, the gas being injected with sufficient energy to grind particles in the chamber and to break off particles of sufficiently small size that the broken off particles can serve as seed particles to receive silicon deposited from the silicon-bearing gas.

29. A process for the deposition of silicon on particles that are located inside a vessel, the process comprising:

providing a vessel having a wall which defines a chamber and a fluidizing inlet for delivering gas into the chamber; and injecting a silicon-bearing gas through the fluidizing inlet under conditions such that (a) particles in the chamber are maintained in a fluidized bed, (b) silicon is deposited on the particles, and (c) seed particles are inherently oriented in the position of maximum drag relative to the gas flow, which position is indicated by the particle Reynolds number range of 5.5 to 200.

30. A process for the deposition of silicon on particles that are located inside a vessel, the process comprising:

providing a vessel having a wall which defines a chamber and a fluidizing inlet for delivering gas into the chamber; and injecting a silicon-bearing gas through the fluidizing inlet at conditions such that (a) particles in the chamber are maintained in a fluidized bed, (b) silicon is deposited on the particles, and (c) at least a portion of the bed is maintained at a voidage between 0.35 and 0.55 in a zone having a negative velocity profile.

31. A process for the deposition of silicon on particles that are located inside a vessel, the process comprising:

providing a vessel having a wall which defines a chamber and a fluidizing inlet for delivering gas into the inlet zone;

injecting a silicon-bearing gas through the fluidizing inlet to provide a fluidizing jet in the chamber without passing the gas through a distribution plate so as to maintain particles in the chamber in a fluidized bed and deposit silicon on the particles; and prior to allowing the wall of the vessel to cool by more than 100° C., at least partially removing deposited silicon from the wall by etching at or near the operating temperature using a halogen-containing gaseous etchant.

32. A process for the deposition of silicon on particles that are located inside a vessel, the process comprising:

providing a vessel having a wall which defines a chamber and a fluidizing inlet for delivering gas into the chamber;

injecting a silicon-bearing gas through the fluidizing inlet in such a manner as to both (a) thermally decompose the silicon-bearing gas in the chamber such that silicon is deposited on particles in the chamber and (b) provide a fluidizing jet in the chamber without passing the gas through a distribution plate, which jet contacts the particles so as to circulate the particles in the chamber; and while the silicon is being deposited on the particles, holding the particles in the chamber at a temperature of 700° C. to 1200° C. to remove hydrogen from the silicon deposited on the particles and to promote polycrystalline structure in the silicon deposited on the particles.

33. A process for the deposition of silicon on particles that are located inside a vessel, the process comprising:

providing a vessel having a wall which defines a chamber and a fluidizing inlet for delivering gas into the chamber, and having a gas delivery tube which defines a gas inlet passageway that is in communication with the fluidizing inlet;

injecting a silicon-bearing gas through the fluidizing inlet to provide a fluidizing jet in the chamber without passing the gas through a distribution plate so as to maintain particles in the chamber in a fluidized bed and deposit silicon on the particles;

heating material inside the chamber by directing radiant energy from a source of radiant energy, via the gas delivery tube, and to a location inside the chamber; and maintaining the wavelength distribution of the radiant energy such that energy absorbed by silicon-bearing gas inside the chamber is insufficient to cause decomposition of that gas and such that any residual energy is absorbed by the particles.

34. A process for the deposition of silicon on particles that are located inside a vessel, the process comprising:

providing a vessel having a wall which defines a chamber, a portion of which is an inlet zone, and which defines a fluidizing inlet for delivering gas into the inlet zone;

injecting a silicon-bearing gas through the fluidizing inlet so as to maintain particles in the chamber in a fluidized bed and deposit silicon on the particles; and injecting a halogen-containing gas into the inlet zone to heat a region of the inlet zone by energy released from an exothermic reaction of the halogen-containing gas with a fraction of silicon-containing species in the inlet zone, the amount of energy produced by the reaction being sufficient to heat particles in the inlet zone.

35. A process for the deposition of silicon on particles that are located inside a vessel, the process comprising:

providing a vessel having a wall which defines a chamber, a fluidizing inlet for delivering gas into the chamber, and a supplemental inlet to deliver gas into the chamber at a location above the fluidizing inlet;

injecting a silicon-bearing gas through the fluidizing inlet to provide a fluidizing jet in the chamber without passing the gas through a distribution plate so as to maintain particles in the chamber in a fluidized bed to circulate the particles in the chamber; and injecting a gas through the supplemental inlet in such a manner that grinding of particles occurs in the chamber and ground particles of sufficiently small size are formed to serve as seed particles on which silicon is deposited.

* * * * *